US010079225B2

(12) United States Patent
Lin et al.

(10) Patent No.: US 10,079,225 B2
(45) Date of Patent: Sep. 18, 2018

(54) DIE PACKAGE WITH OPENINGS SURROUNDING END-PORTIONS OF THROUGH PACKAGE VIAS (TPVS) AND PACKAGE ON PACKAGE (POP) USING THE DIE PACKAGE

(71) Applicant: Taiwan Semiconductor Manufacturing Company, Ltd., Hsinchu (TW)

(72) Inventors: Jing-Cheng Lin, Hsinchu (TW); Jui-Pin Hung, Hsinchu (TW); Li-Hui Cheng, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/493,985

(22) Filed: Apr. 21, 2017

(65) Prior Publication Data
US 2017/0229432 A1     Aug. 10, 2017

Related U.S. Application Data

(63) Continuation of application No. 15/192,310, filed on Jun. 24, 2016, which is a continuation of application
(Continued)

(51) Int. Cl.
*H01L 21/768*     (2006.01)
*H01L 23/552*     (2006.01)
(Continued)

(52) U.S. Cl.
CPC .......... *H01L 25/105* (2013.01); *H01L 21/486* (2013.01); *H01L 21/6836* (2013.01);
(Continued)

(58) Field of Classification Search
USPC ......... 438/127, 618, 118, 50, 637, 667, 106; 257/664, 508, 467, 415, 737, 666, 621,
(Continued)

(56) References Cited

U.S. PATENT DOCUMENTS

2008/0142944 A1     6/2008  Oi et al.
2008/0224298 A1     9/2008  Corisis et al.
(Continued)

FOREIGN PATENT DOCUMENTS

CN     101632175 A     1/2010
CN     102150258 A     8/2011
(Continued)

*Primary Examiner* — Moin Rahman
(74) *Attorney, Agent, or Firm* — Slater Matsil, LLP

(57) ABSTRACT

Various embodiments of mechanisms for forming through package vias (TPVs) with openings surrounding end-portions of the TPVs and a package on package (PoP) device with bonding structures utilizing the TPVs are provided. The openings are formed by removing materials, such as by laser drill, surrounding the end-portions of the TPVs. The openings surrounding the end-portions of the TPVs of the die package enable solders of the bonding structures formed between another die package to remain in the openings without sliding and consequently increases yield and reliability of the bonding structures. Polymers may also be added to fill the openings surrounding the TPVs or even the space between the die packages to reduce cracking of the bonding structures under stress.

20 Claims, 23 Drawing Sheets

Related U.S. Application Data

No. 13/791,245, filed on Mar. 8, 2013, now Pat. No. 9,378,982.

(60) Provisional application No. 61/759,054, filed on Jan. 31, 2013.

(51) Int. Cl.
*H01L 25/10* (2006.01)
*H01L 25/00* (2006.01)
*H01L 23/00* (2006.01)
*H01L 21/48* (2006.01)
*H01L 23/498* (2006.01)
*H01L 21/683* (2006.01)

(52) U.S. Cl.
CPC .. *H01L 23/49816* (2013.01); *H01L 23/49827* (2013.01); *H01L 24/19* (2013.01); *H01L 24/97* (2013.01); *H01L 25/50* (2013.01); *H01L 2221/68345* (2013.01); *H01L 2221/68372* (2013.01); *H01L 2221/68381* (2013.01); *H01L 2224/12105* (2013.01); *H01L 2224/24146* (2013.01); *H01L 2224/24991* (2013.01); *H01L 2224/95001* (2013.01); *H01L 2225/1035* (2013.01); *H01L 2225/1058* (2013.01)

(58) Field of Classification Search
USPC .......................................... 257/773–774, 712
See application file for complete search history.

(56) References Cited

U.S. PATENT DOCUMENTS

| | | | |
|---|---|---|---|
| 2009/0206461 | A1 | 8/2009 | Yoon |
| 2010/0059898 | A1* | 3/2010 | Keeth ..................... H01L 23/50 257/777 |
| 2010/0279466 | A1 | 11/2010 | Corisis et al. |
| 2011/0278736 | A1* | 11/2011 | Lin .......................... H01L 25/50 257/774 |
| 2011/0285005 | A1 | 11/2011 | Lin et al. |
| 2012/0012991 | A1* | 1/2012 | Chandrasekaran ......................... H01L 23/3121 257/660 |
| 2012/0228780 | A1* | 9/2012 | Kim ........................ H01L 23/36 257/774 |
| 2013/0134582 | A1 | 5/2013 | Yu et al. |
| 2013/0168848 | A1 | 7/2013 | Lin et al. |
| 2013/0277854 | A1* | 10/2013 | Wong ................ H01L 21/76898 257/774 |
| 2014/0117556 | A1 | 5/2014 | Lin |
| 2014/0203446 | A1 | 7/2014 | Liu et al. |

FOREIGN PATENT DOCUMENTS

| | | |
|---|---|---|
| KR | 20120033843 A | 4/2012 |
| WO | 2012009588 A2 | 1/2012 |

\* cited by examiner

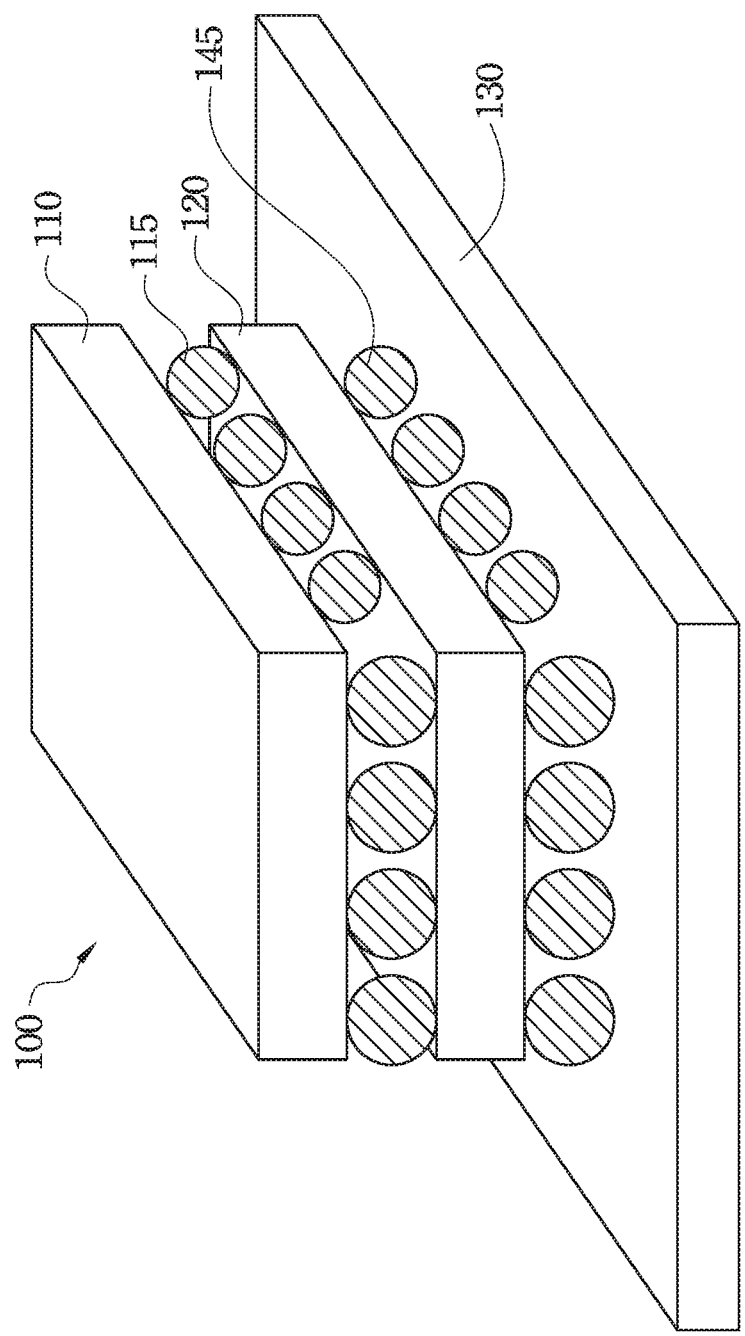

DIE PACKAGE WITH OPENINGS SURROUNDING END-PORTIONS OF THROUGH PACKAGE VIAS (TPVS) AND PACKAGE ON PACKAGE (POP) USING THE DIE PACKAGE

This application is a continuation application of U.S. patent application Ser. No. 15/192,310, filed on Jun. 24, 2016, entitled "Die package with Openings Surrounding End-portions of Through Package Vias (TPVs) and Package on Package (PoP) Using the Die Package," which is a continuation application of U.S. patent application Ser. No. 13/791,245, now U.S. Pat. No. 9,378,982, filed on Mar. 8, 2013, entitled "Die package with Openings Surrounding End-portions of Through Package Vias (TPVs) and Package on Package (PoP) Using the Die Package," which is a non-provisional and claims the benefit of U.S. Patent Application Ser. No. 61/759,054, filed on Jan. 31, 2013, entitled "Die package with Openings Surrounding End-portions of Through Package Vias (TPVs) and Package on Package (PoP) Using the Die Package."

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1A is a perspective view of a package structure, in accordance with some embodiments;

DETAILED DESCRIPTION OF ILLUSTRATIVE EMBODIMENTS

Figure 1B:
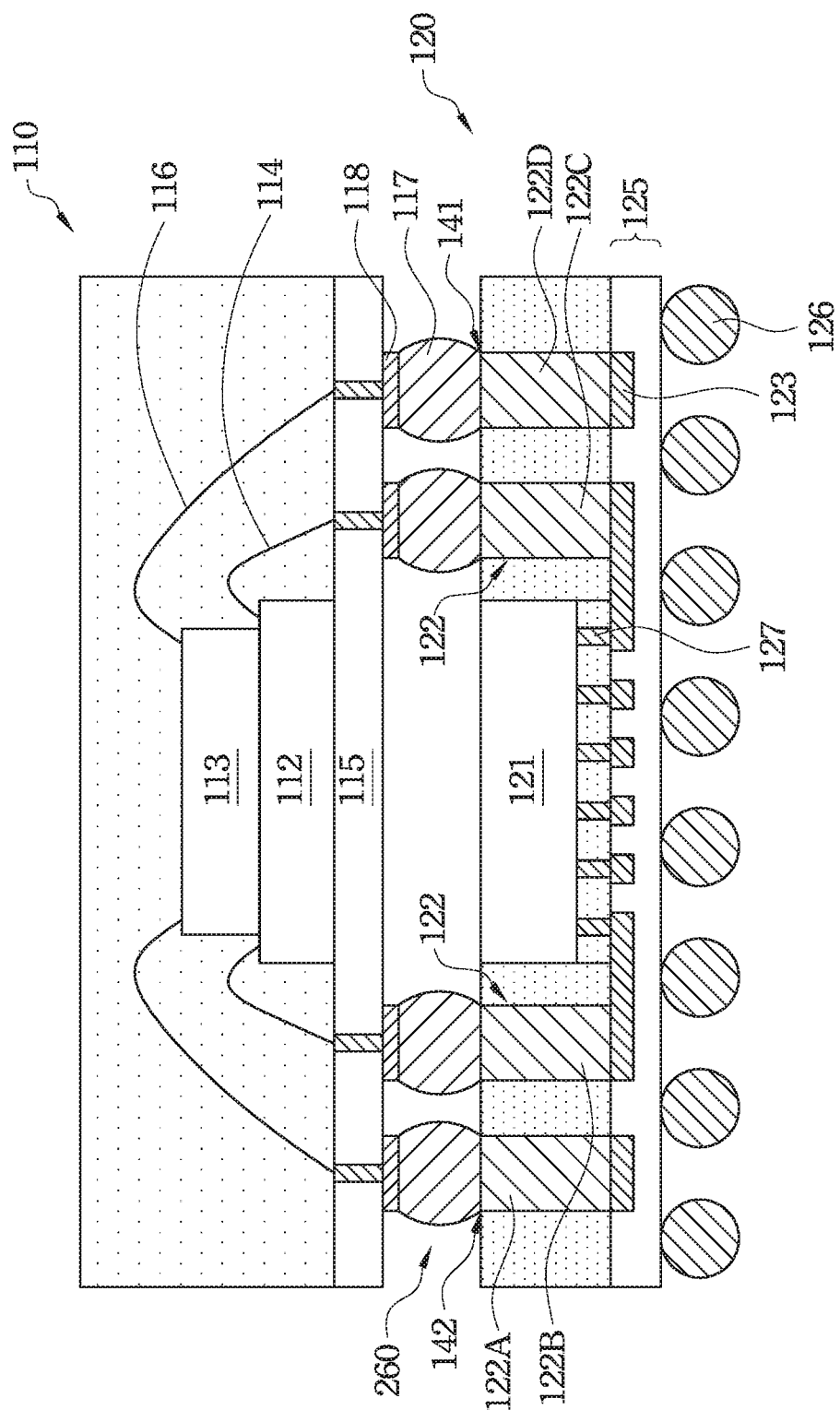
FIG. 1B show a cross-sectional view of a die package bonded to another die package, in accordance with some embodiments.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more wafers, each including an integrated circuit, are formed. The wafers are sawed to form dies. Dies with the same or different devices are packaged and are then bonded with the devices aligned. Through-package-vias (TPVs), also referred to as through-molding-vias (TMVs), are increasingly used as a way of implementing 3D ICs. Through vias (TVs), such as TPVs, are often used in 3D ICs and stacked dies to provide electrical connections and/or to assist in heat dissipation. In addition to TPVs and TMVs, TVs also include through silicon vias (TSVs) and other applicable structures.

FIG. 1A is a perspective view of a package structure 100 including a package 110 bonded to another package 120, which is further bonded to another substrate 130 in accordance with some embodiments. Each of die packages 110 and 120 includes at least a semiconductor die (not shown). The semiconductor die includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices. Package 120 includes through-package-vias (TPVs) and function as an interposer, in accordance with some embodiments.

Substrate 130 may be made of bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals. In some embodiments, substrate 130 is a multiple-layer circuit board. Package 110 is bonded to package 120 via connectors 115, and package 120 is bonded to substrate 130 via external connectors 145. In some embodiments, the external connectors 145 are bonded bump structures, such as bonded solder bumps, or bonded copper posts with a joining solder layer. Solder described here may include lead or may be lead-free.

FIG. 1B show a cross-sectional view of a die package 110 over a die package 120, in accordance with some embodiments. As shown in FIG. 1B, package 110 includes a two semiconductor dies 112 and 113, with die 113 disposed over die 112. However, package 110 could include one semiconductor die or more than two semiconductor dies. In some embodiments, there is a glue layer (not shown) between dies 112 and 113. Semiconductor dies 112 and 113 may include various microelectronic elements, as described above for semiconductor dies. Semiconductor die 112 is bonded to a substrate 115. Substrate 115 may include various materials and/or components described above for substrate 100. Semiconductor die 112 is electrically connected to conductive elements (not shown) in substrate 115 via bonding wires 114, in accordance with some embodiments. Similarly, semiconductor die 113 is electrically connected to the conductive elements in substrate 115 via bonding wires 116. Package 110 also includes a molding compound 111, which covers semiconductor dies 112 and 113, and also bonding wires 114 and 116. Package 110 also includes a number of connectors 117 for external connections. Connectors 117 are formed on metal pads 118, which are electrically connected to bonding wires 114 and 116 by interconnect structures 119, which may include vias and metal lines.

Die package 120 includes a semiconductor die 121 and TPVs 122, which surround die 121, as shown in FIG. 1B in accordance with some embodiments. Package 120 also includes a redistribution structure 125, which includes one or more redistribution layers (RDLs) 123. Redistribution layers (RDLs) 123 are metal interconnect layers, which may include metal lines and vias, and are surrounded by dielectric material(s). RDL(s) 123 enables fan-out of die 121. External connectors 126, such as ball grid array (BGA), are attached to metal pads (not shown) on redistribution structure 125, as shown in FIG. 1B. As shown in FIG. 1B, TPVs 122 are connected to connectors 117 of package 110. Die 121 and external connectors 126 are on opposite sides of redistribution structure 125. Die 121 is connected to redistribution structure 125 via connectors 127.

Connectors 117 of die package 110 are made of solders, in some embodiments. In some embodiments, connectors 117 include copper posts with solder at the ends of solder posts. The solder of connectors 117 are bonded to exposed copper surface of TPVs 122, which are filled with copper. However, the exposed copper surface could form copper oxide when exposed to atmosphere. As a result, a copper oxide layer 141, as shown in TPV $122_D$ of FIG. 1B, could form on the surface of TPVs 122. Although a flux could be applied on the surface of TPVs 122 to remove the copper oxide layer formed on the surface of TPVs 122, the removal process is inconsistent in some embodiments. As a result, copper oxide layer 141, or at least a portion of copper oxide layer 141, remains on some TPVs 122, such as TPV $122_D$. Solder of connectors 126 does not bond well to copper oxide layer 141; therefore, the joint would be weak, which would affect yield and reliability.

Even if flux does remove the copper oxide layer from TPVs, such as TPVs $122_A$, $122_B$, and $122_C$, the direct contact between solder of connectors 126 and copper of TPVs would result in the formation of intermetallic compound (IMC), such as Cu:Sn. FIG. 1B shows IMC layer 142 formed between solder of connectors 126 and copper of TPVs $122_A$, $122_B$, and $122_C$, in accordance with some embodiments. Due to varying coefficients of thermal expansion (CTEs) of different elements on package 120, package 120 could bow during and/or after packaging process. Such bowing (or warpage) creates stress for the bonding structures, formed by bonded connectors 126 and TPVs 122, between package 120 and package 110. The stress could cause cracking near IMC layer 142, formed at the interface between TPVs 122 and connectors 117, of the bonding structures 260 (formed by connectors 117 and TPVs 122) to affect yield and reliability of the package-on-package (PoP) structure. Consequently, there is a need of mechanisms for forming bonding structures between die packages without the issues described above.

Figure 2A:
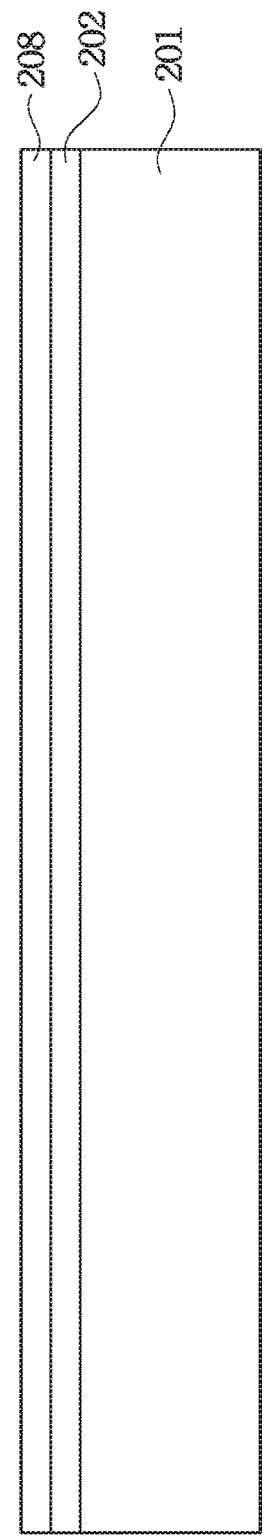
FIGS. 2A-2O show cross-sectional views of a sequential process flow of preparing a package on package (PoP) device, in accordance with some embodiments.

FIGS. 2A-2O show cross-sectional views of a sequential process flow of preparing a package on package (PoP) device, in accordance with some embodiments. FIG. 2A shows an adhesive layer (or glue layer) 202, which is over carrier 201. Carrier 201 is made of glass, in accordance with some embodiments. However, other materials may also be used for carrier 201. Adhesive layer 202 is deposited or laminated over carrier 201, in some embodiments. Adhesive layer 202 may be formed of a glue, or may be a lamination material, such as a foil. In some embodiments, adhesive layer 202 is photosensitive and is easily detached from carrier 201 by shining ultra-violet (UV) light or laser on carrier 201 after the involved packaging process is completed 120. For example, adhesive layer 202 may be a light-to-heat-conversion (LTHC) coating made by 3M Company of St. Paul, Minn. In some other embodiments, the adhesive layer 202 is heat-sensitive.

A passivation layer 208 is formed over adhesive layer 202, in some embodiments. The passivation layer 208 is dielectric and functions as a passivation layer over die package. In some embodiments, passivation layer 208 is made of polymers, such as polyimide, polybenzoxazole (PBO)), or a solder resist. Passivation layer 208 improves the adhesion of a plating seed layer (descried below) formed over carrier 201. If the plating seed layer can adhere well to the adhesive layer 202, the formation of passivation layer 208 can be skipped.

Figure 2B:
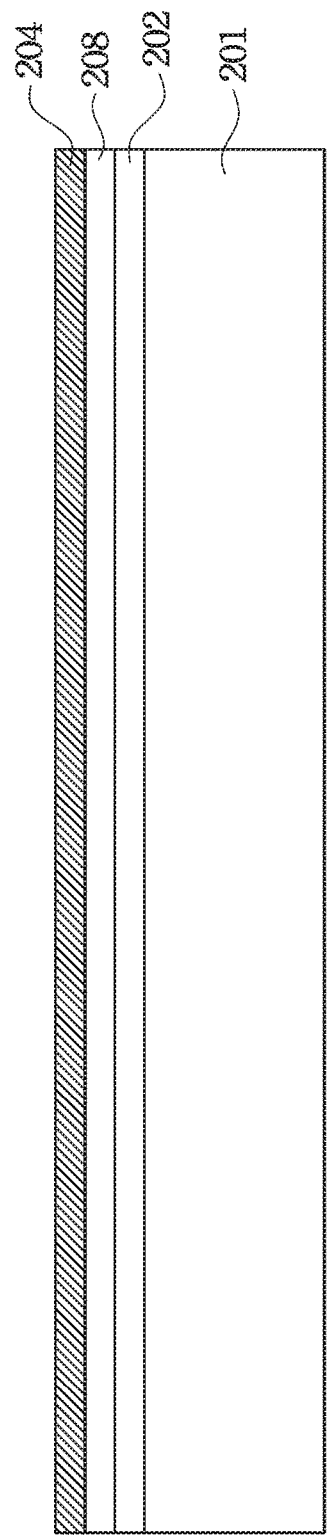

A plating seed layer 204 is then formed on the passivation layer 208, as shown in FIG. 2B in accordance with some embodiments. In some embodiments, the plating seed layer 204 is made of copper and is formed by physical vapor deposition (PVD). However, other conductive film may also be used. For example, the plating seed layer 204 may be made of Ti, Ti alloy, Cu, and/or Cu alloy. The Ti alloy and Cu alloy may include silver, chromium, nickel, tin, gold, tungsten, and combinations thereof. In some embodiments, the thickness of the plating seed layer 204 is in a range from about 0.05 μm to about 1.0 μm. In some embodiments, the plating seed layer 204 includes a diffusion barrier layer, which is formed prior to the deposition of the plating seed layer. The plating seed layer 204 may also act as an adhesion layer to under layer. In some embodiments, the diffusion barrier layer is made of Ti with a thickness in a range from about 0.01 μm to about 0.1 μm. However, the diffusion barrier layer may be made of other materials, such as TaN, or other applicable materials and the thickness range is not limited to the range described above. The diffusion barrier layer is formed by PVD in some embodiments.

Figure 2C:
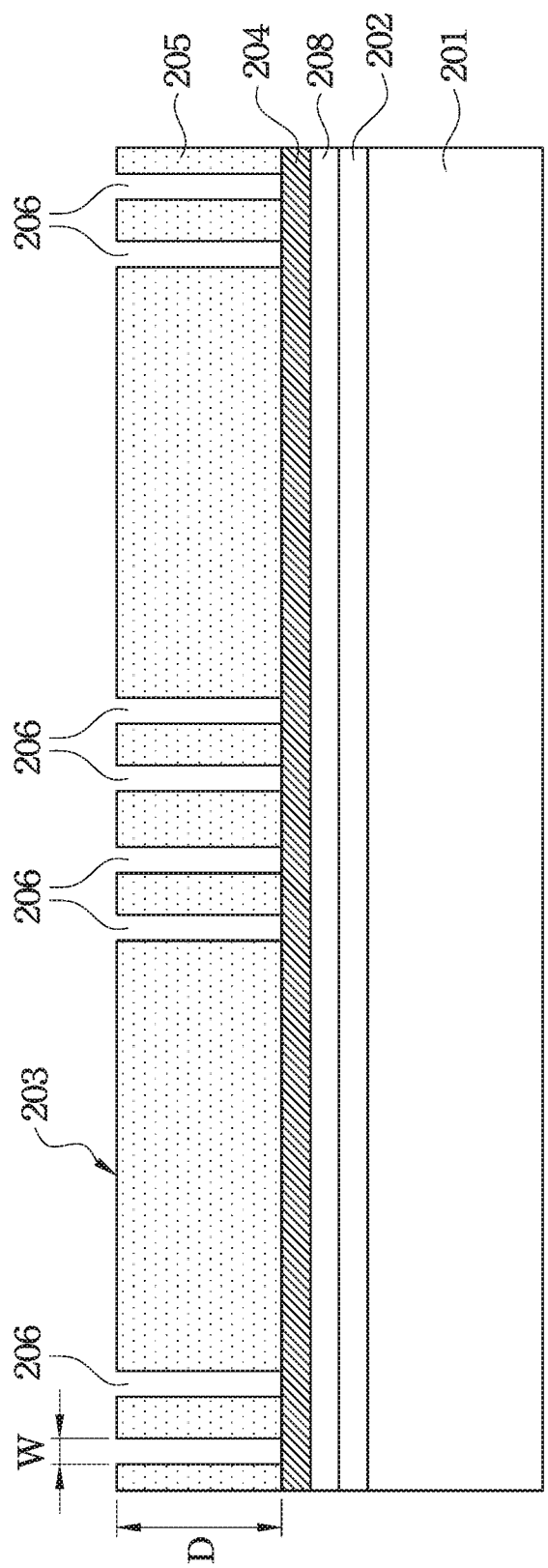

Following the deposition of the plating seed layer 204, a photoresist layer 205 is formed over plating seed layer 204, as shown in FIG. 2C in accordance with some embodiments. The photoresist layer 205 may be formed by a wet process, such as a spin-on process, or by a dry process, such as by a dry film. After the photoresist layer 205 is formed, the photoresist layer 205 is patterned to formed openings 206, which are filled to form TPVs described above in FIG. 1B. The processes involved include photolithography and resist development. In some embodiments, the width W of openings 206 is in a range from about 40 μm to about 260 μm. In some embodiments, the depth D of openings 206 is in a range from about 5 μm to about 300 μm.

Figure 2D:
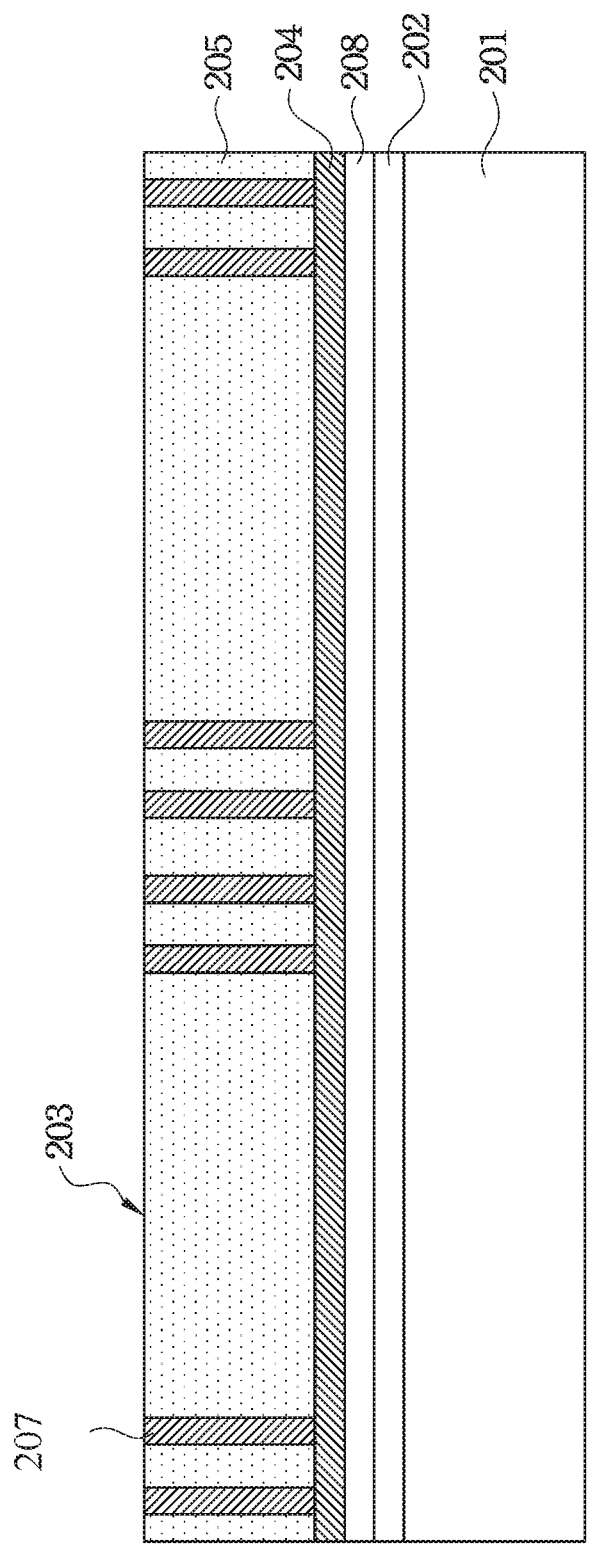

Afterwards, a conductive layer 207 is plated over the plating seed layer 204 to fill openings 206, as shown in FIG. 2D in accordance with some embodiments. In some embodiments, the conductive layer 207 is made of copper, or a copper alloy. In some embodiments, the thickness of layer 207, D, is in a range from about 5 μm to about 300 μm.

Figure 2E:
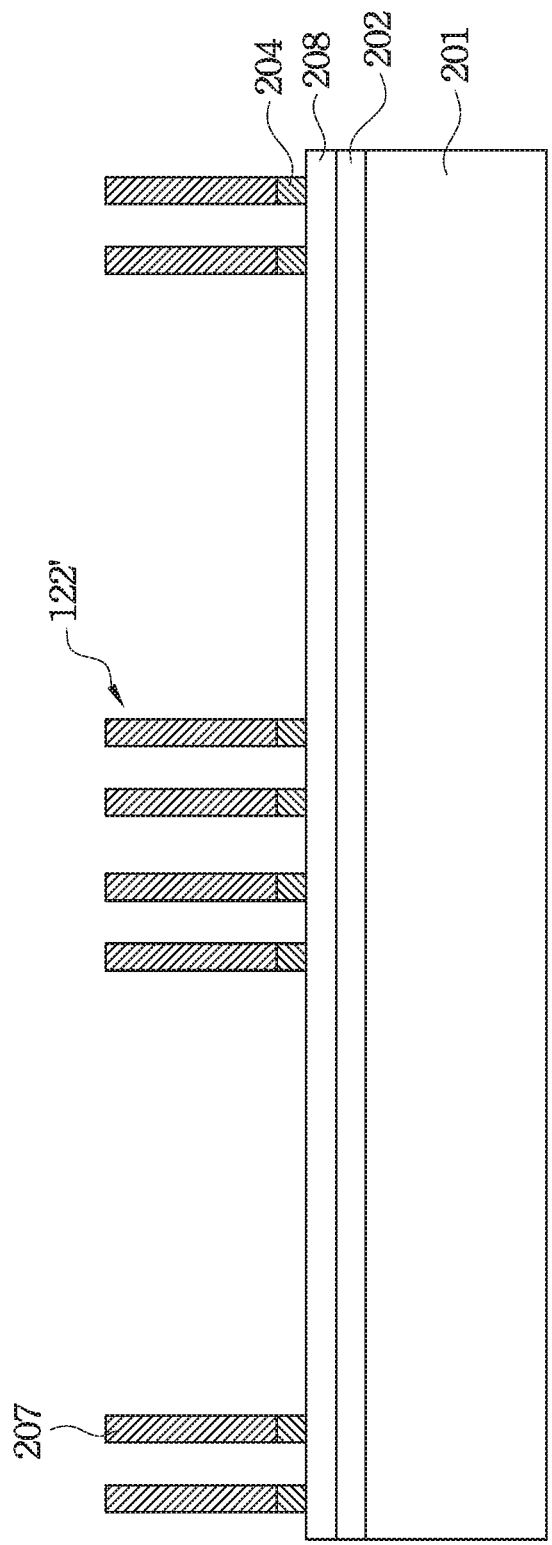

Following the plating to gap-fill process, the photoresist layer 205 is removed by an etching process, which may be a dry or a wet process. In some embodiments, a planarization process is used to remove excess conductive layer 207 formed above surface 203 of photoresist layer 205 prior to the removal of the photoresist layer 205. FIG. 2E shows a cross-sectional view of the structure on carrier 201 after the photoresist layer 205 is removed and conductive layer 207 in the openings 206 are exposed as (conductive) columns 122', in accordance with some embodiments.

After the photoresist layer 205 is removed and the conductive layer 207 is shown as columns 122', the exposed plating seed layer 204, or the portions of plating seed layer 204 not under conductive layer 207, is removed. The plating seed layer 204 is removed by etching, such as by a wet etch. To remove copper, an aqueous solution with phosphoric acid ($H_3PO_4$) and hydrogen peroxide ($H_2O_2$) may be used. If the plating seed layer 204 includes a diffusion barrier layer, such as a Ti layer, an aqueous solution of HF can be used. FIG. 2E shows that the plating seed layer 204 under conductive layer 207 is kept and the remaining portions (or exposed portions) are removed.

Figure 2F:
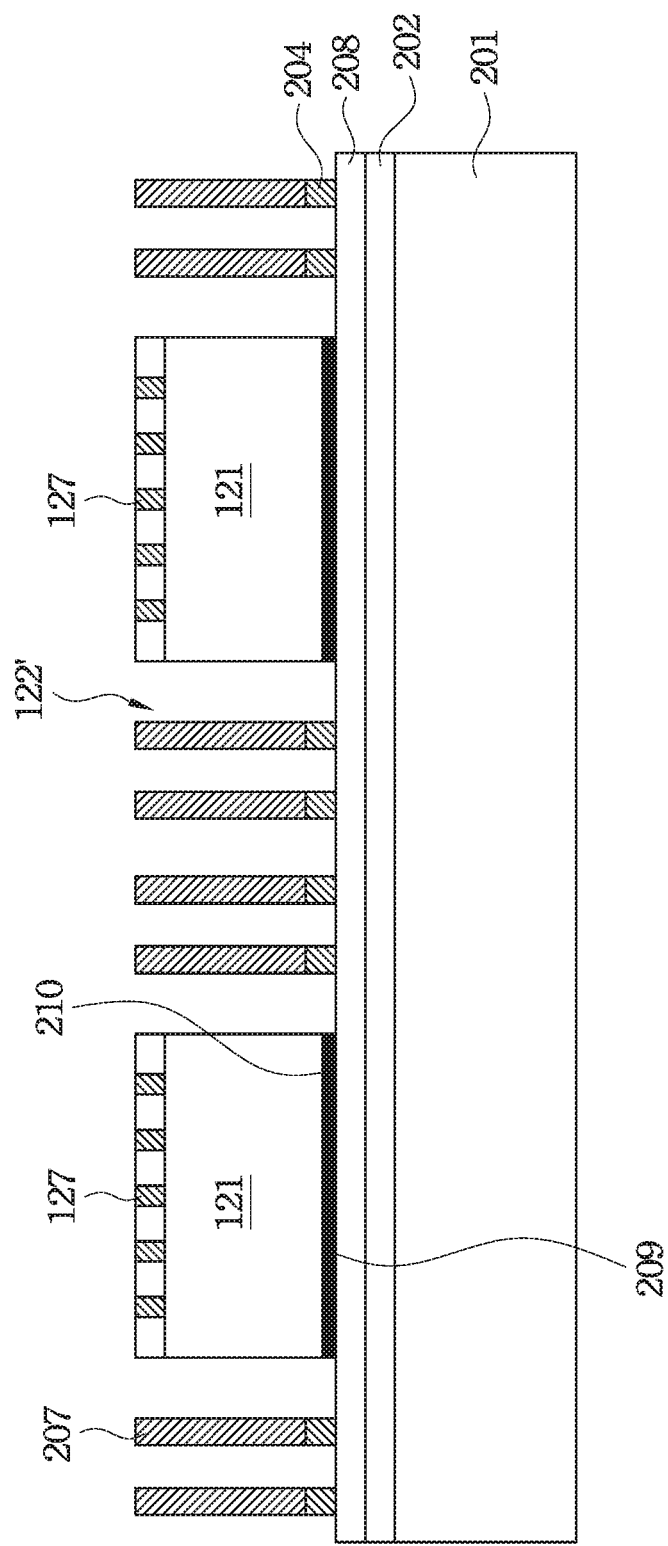
Figure 2G:
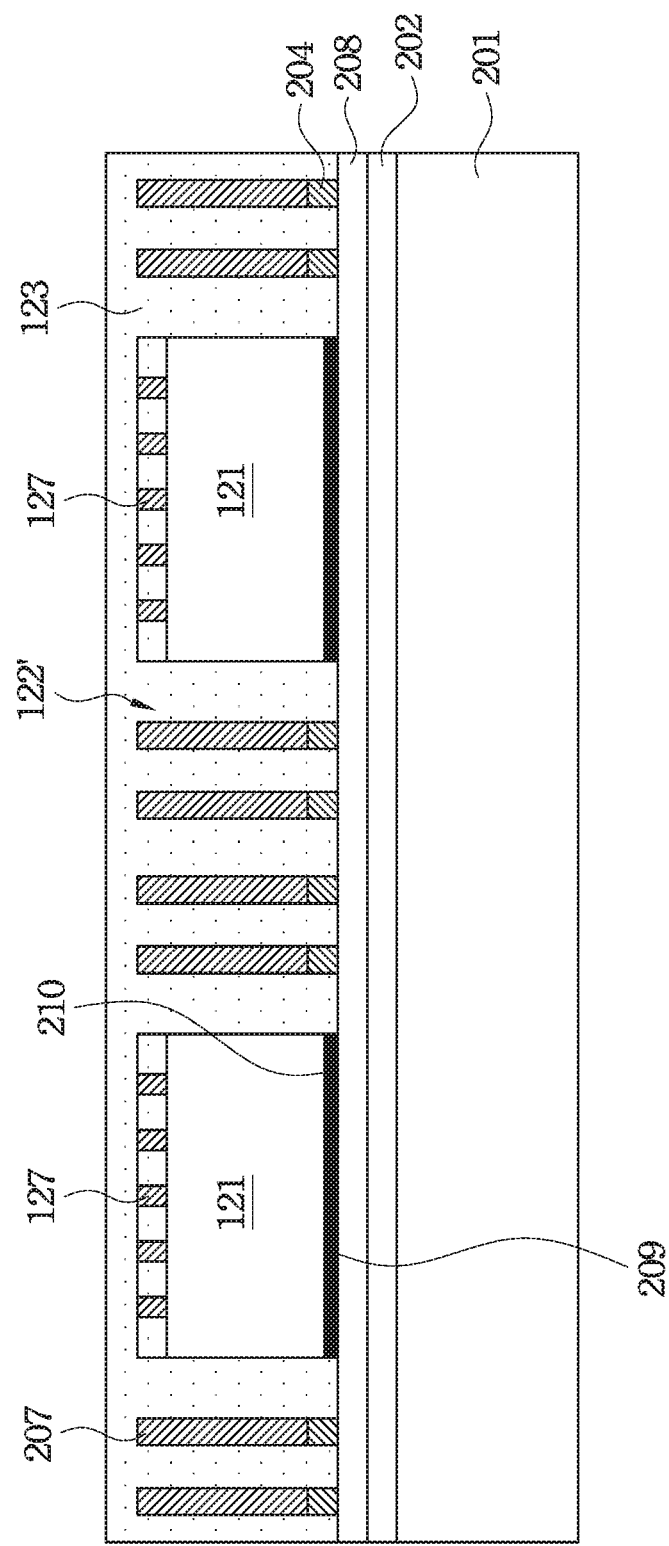

Afterwards, semiconductor die 121 is attached to a surface 209 over carrier 201 by a glue layer 210, as shown in FIG. 2F in accordance with some embodiments. Glue layer 210 is made of a die attach film (DAF), in accordance with some embodiments. DAF may be made of epoxy resin, phenol resin, acrylic rubber, silica filler, or a combination thereof. FIG. 2F shows that connectors 127 of die 121 are facing away from the surface 209, which is over passivation layer 208. A liquid molding compound material is then applied on the surface of plating seed layer 204 over carrier 201 to fill the space between conductive columns 122' and die 121 and to cover die 121 and conductive columns 122'. A thermal process is then applied to harden the molding compound material and to transform it into molding compound 123. Conductive columns 122' become TPVs 122" after the molding compound 123 is formed to surround them, as shown in FIG. 2G in accordance with some embodiments.

Afterwards, a planarization process is applied to remove excess molding compound 123 to expose TPVs 122" and connectors 127 of die 121. In some embodiments, the planarization process is a grinding process. In some other embodiments, the planarization process is a chemical-mechanical polishing (CMP) process. The post planarization structure is shown in FIG. 2H in accordance with some embodiments.

Figure 2H:
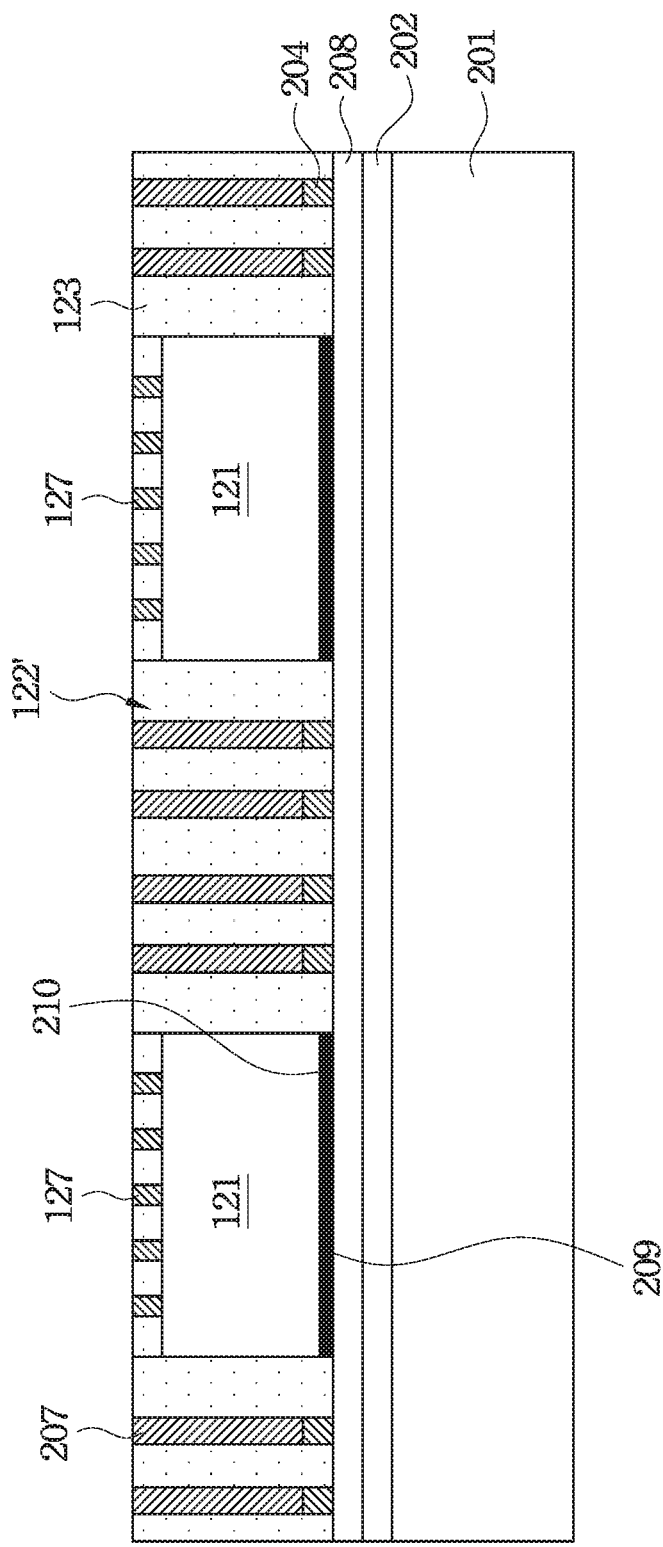
Figure 2I:
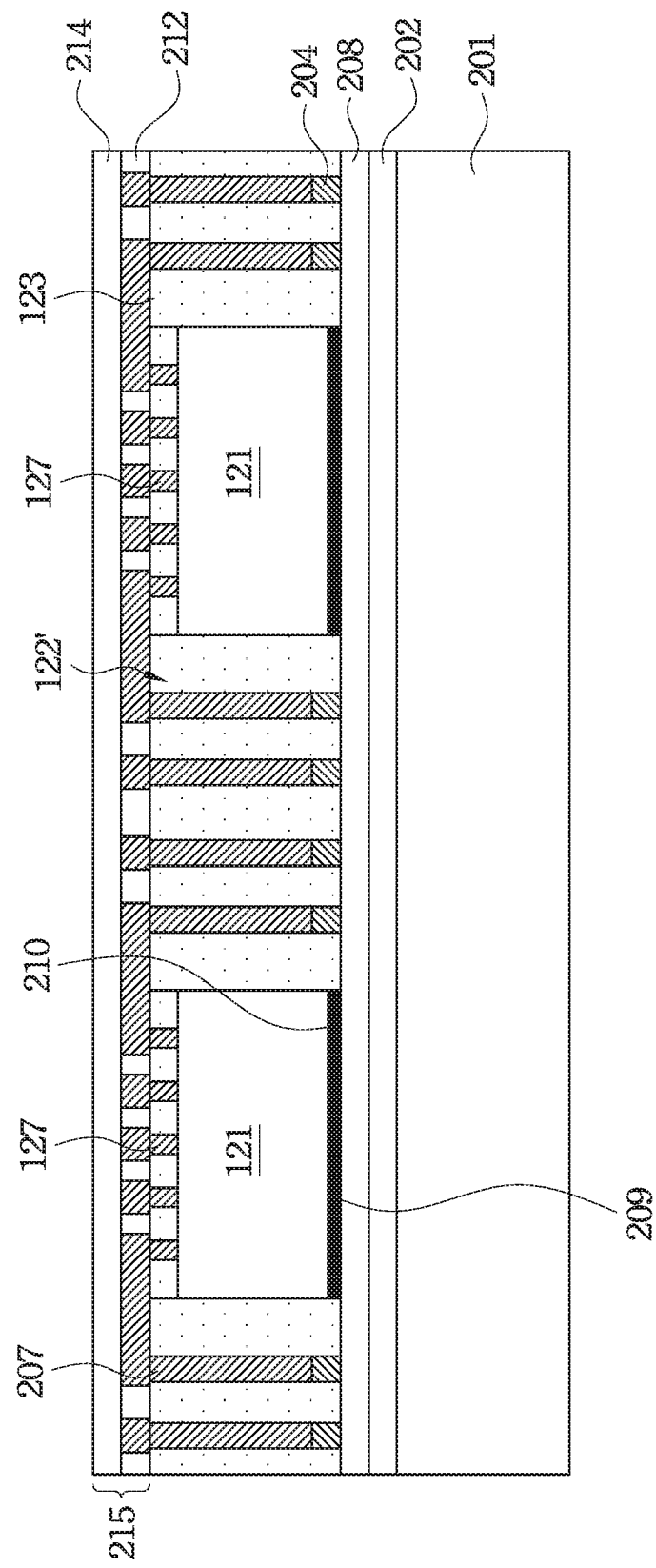

Following the planarization process, redistribution structure 125 is formed over surface 211 over structure of FIG. 2H, as shown in FIG. 2I in accordance with some embodiments. FIG. 2I shows that the second redistribution structure 125 include RDLs 213, which are insulated by one or more passivation layers, such as layer 212 and 214. RDLs 213 may include metal lines and conductive vias. The RDLs 213 are made of a conductive material and directly contacts TPVs 122" and connectors 127 of die 121. In some embodiments, the RDLs 213 are made of aluminum, aluminum alloy, copper, or copper-alloy. However, RDLs 213 may be made of other types of conductive materials. The passivation layers 212 and 214 are made of dielectric material(s) and provide stress relief for bonding stress incurred during bonding external connectors 126 with substrate 130. In some embodiments, the passivation layers 212 and 214 are made of polymers, such as polyimide, polybenzoxazole (PBO), or benzocyclobutene (BCB). Passivation 214 is patterned to form openings (not shown) to expose portions of RDLs 123 to form bond pads (not shown). In some embodiments, an under bump metallurgy (UBM) layer (not shown) is formed over bond pads. The UBM layer may also line the sidewalls of openings of passivation layer 214. The RDLs 213 may be a single layer, in some embodiments.

Examples of redistribution structures and bonding structures, and methods of forming them are described in U.S. application Ser. No. 13/427,753, entitled "Bump Structures for Multi-Chip Packaging," filed on Mar. 22, 2012, and U.S. application Ser. No. 13/338,820, entitled "Packaged Semiconductor Device and Method of Packaging the Semiconductor Device," filed on Dec. 28, 2011. Both above-mentioned applications are incorporated herein by reference in their entireties.

Figure 2J:
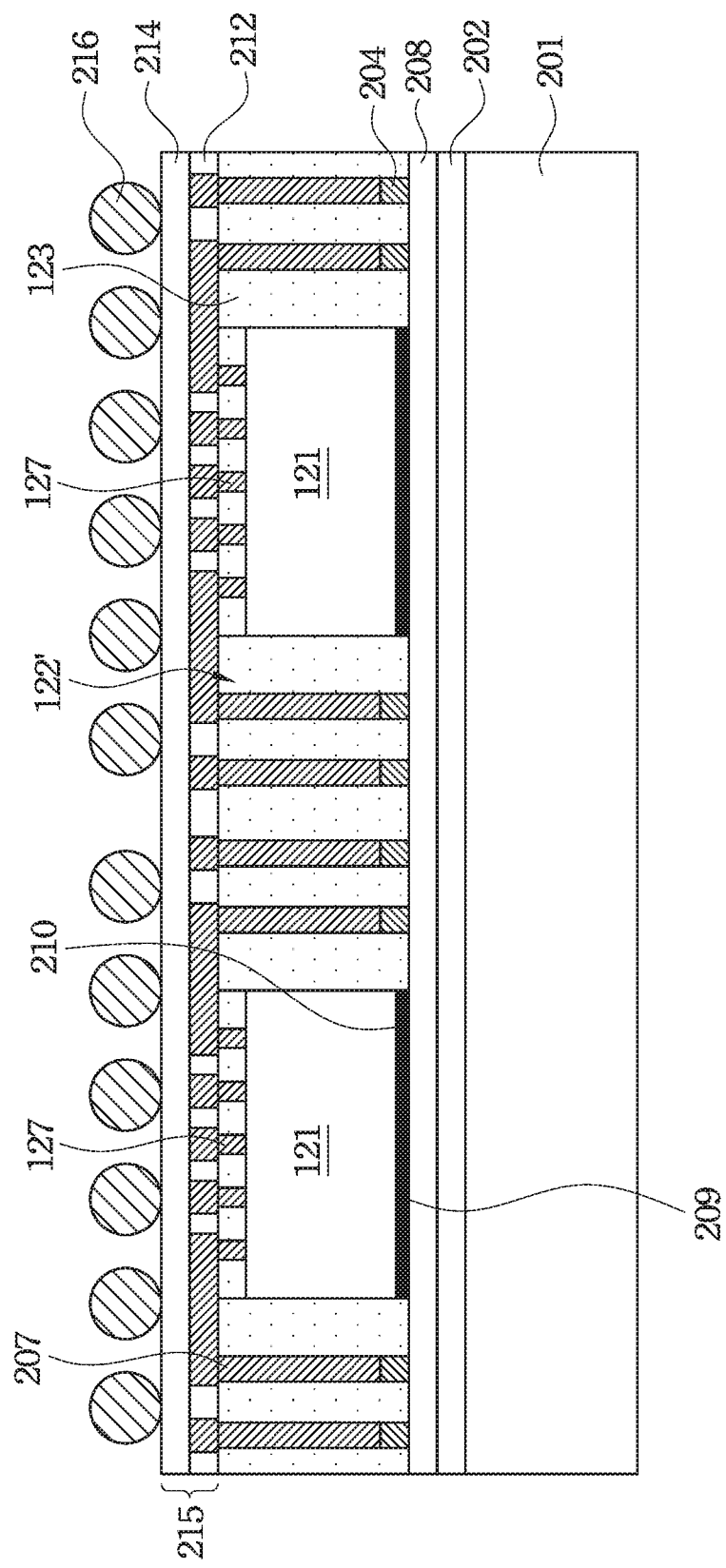

After the redistribution structure 125 is formed, external connectors 126 are mounted on (or bonded to) bond pads (not shown) of redistribution structure 125, as shown in FIG. 2J in accordance with some embodiments. The dies on carrier 201 are electrically tested to check for the functionality of dies and also for the quality of the formation of the TPVs 122", the redistribution structure 125 and bonded external connectors 126, in accordance with some embodiments. In some embodiments, reliability test is also performed.

Figure 2K:
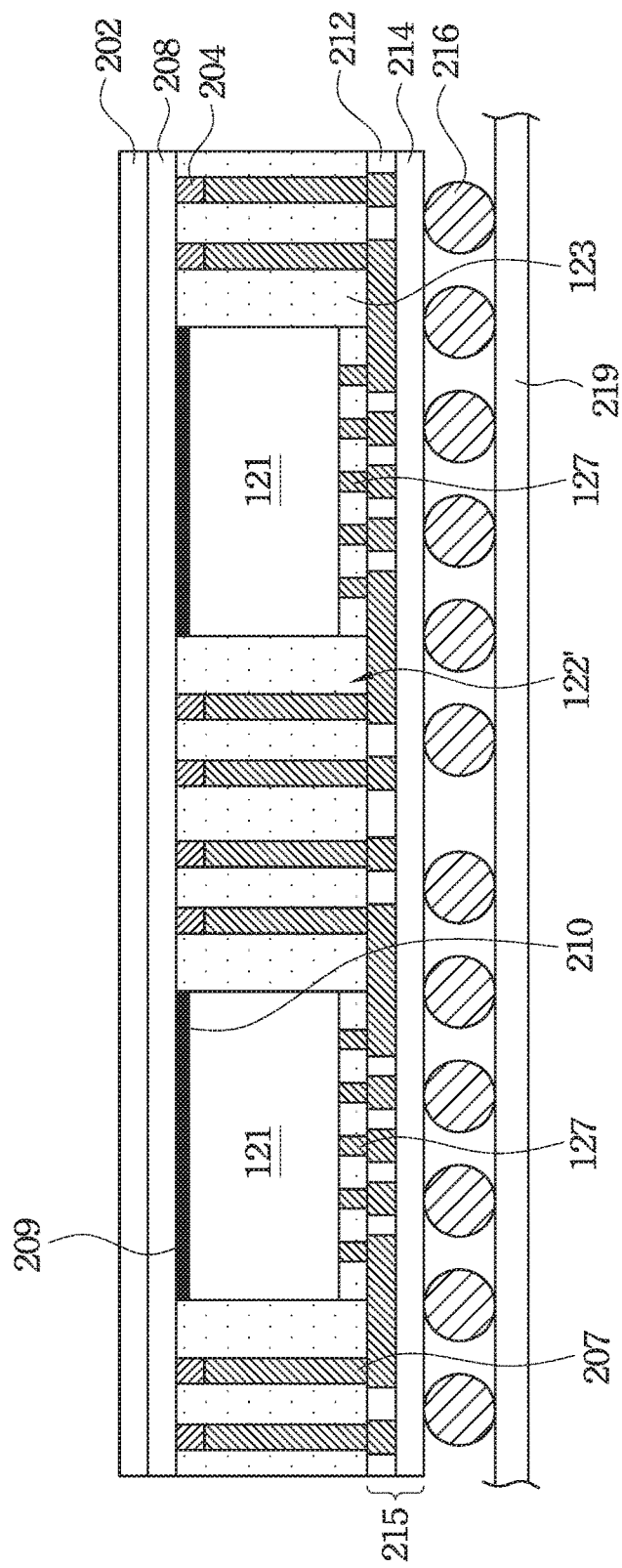
Figure 2L:
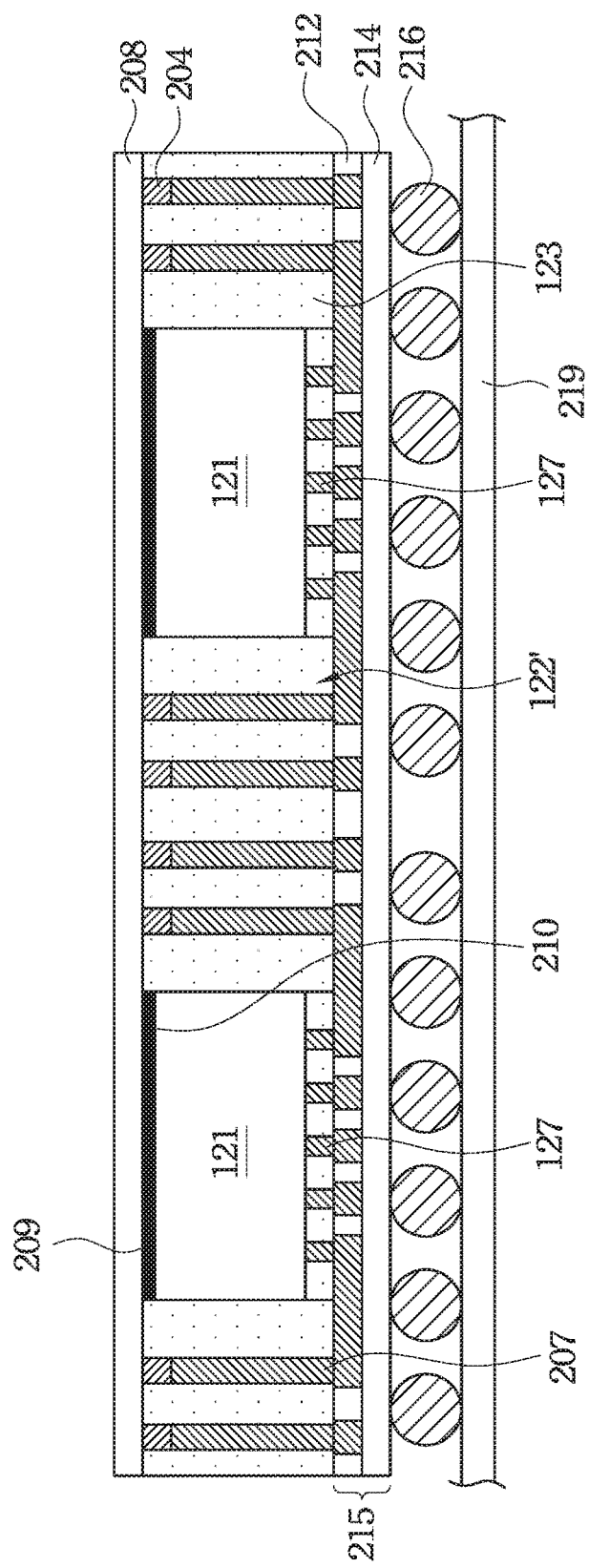

After external connectors 126 are mounted on bond pads, the structure in FIG. 2J is flipped and is attached to a tape 219, as shown in FIG. 2K in accordance with some embodiments. Tape 219 is photosensitive and can be easily detached from a die package of die 121 by shining ultra-violet (UV) light on tape 219, in accordance with some embodiments. After the structure of FIG. 2J is attached to tape 219, adhesive layer 202 is removed. Laser is used to provide heat to remove the adhesive layer 202, in accordance with some embodiments. FIG. 2L shows the structure of FIG. 2K after adhesive layer 202 is removed.

Figure 2M:
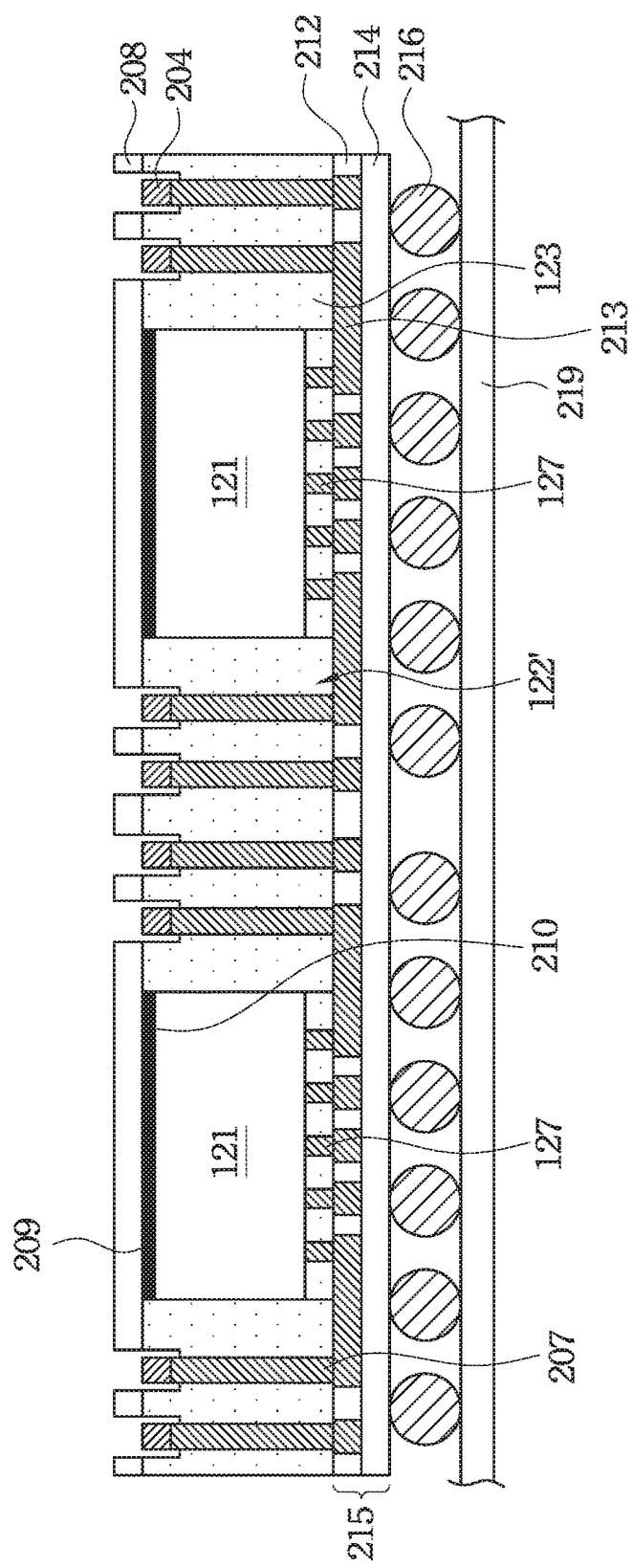

After removing adhesive layer 202, portions of molding compound 123 and passivation layer 208 surrounding top portions (portions away from connectors 126, or end-portions) of TPVs 122" are removed, as shown in FIG. 2M in accordance with some embodiments. In some embodiments, a laser tool is used to remove (by drilling) materials, such as molding compound 123 and passivation layer 208, surrounding the top portions of TPVs 122" to expose the top portions. FIGS. 3A-3H show various embodiments for structures surrounding the exposed top portion of a TPV 122, which will be described in more details below.

Figure 2N:
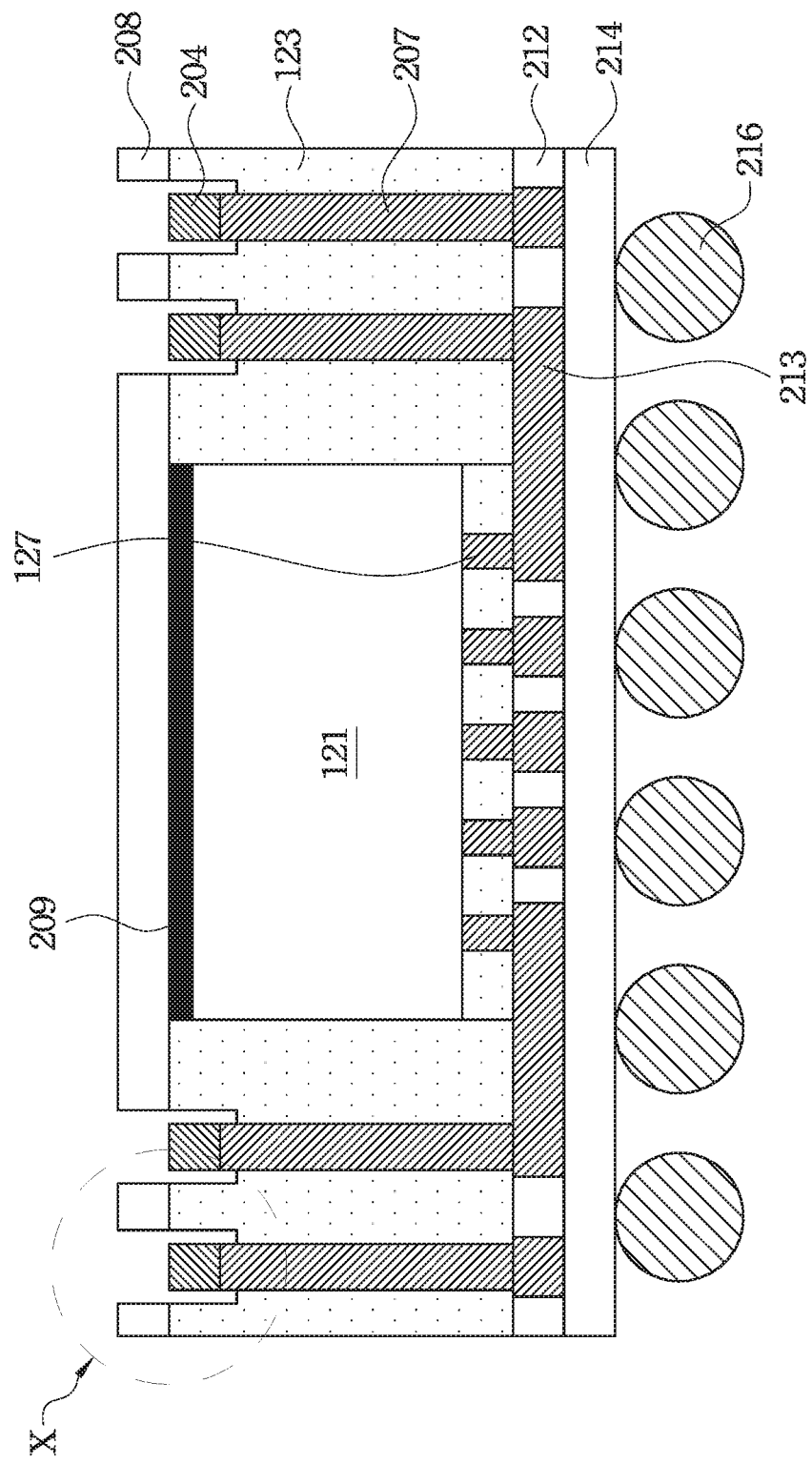
Figure 20:
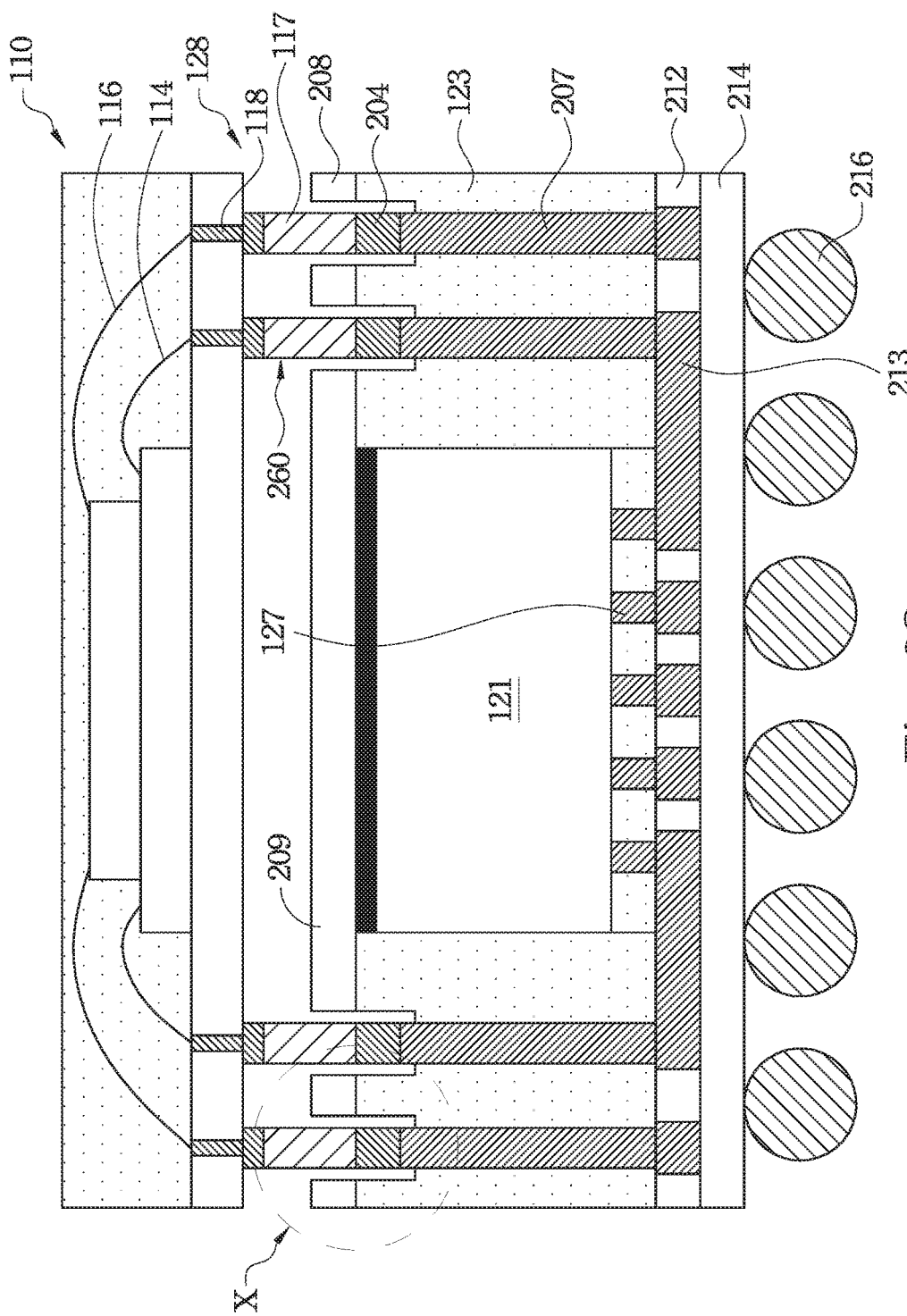

Following removing portions of molding compound 123 and passivation layer 208 surrounding top portions of TPVs 122", the packaging process for semiconductor dies 121 is completed and semiconductor dies 121 are packaged as packaged dies 120'. The packaged dies 120' on tape 219 are then singulated into individual packaged dies 120', in accordance with some embodiments. The singulation is accomplished by die saw. After singulation is completed, tape 219 is removed from the packaged dies. FIG. 2N shows a packaged die 120' following the removal of tape 219, in accordance with some embodiments. Region X in FIG. 2N includes a TPV 122". Various embodiments of structures in region X are shown in FIGS. 3A-3H and are described below.

The individual packaged dies 120' are then bonded to other die packages to form package on package (PoP) structures. A die package 110 is placed over and bonded to die package 120', as shown in FIG. 2O in accordance with some embodiments. External connectors 117 of die package 110 are bonded to TPVs 122" of die package 120' to form bonding structures 260'. Each TPV 122" include a main body, which is made of copper, and a plating seed layer 204, which may be made of copper, Ti, or a combination thereof. The bonding of connectors 117 to PTVs 122" involves a reflow process, which could cause formation of an IMC layer 142' next to the outer (and previously exposed) profile of TPVs 122". The IMC layer 142" contains copper, solder, and Ti, if it is included in the plating seed layer 204. In some embodiments, the thickness of IMC layer 142' is in a range from about 0.5 μm to about 10 μm, in some embodiments.

Figure 4A:
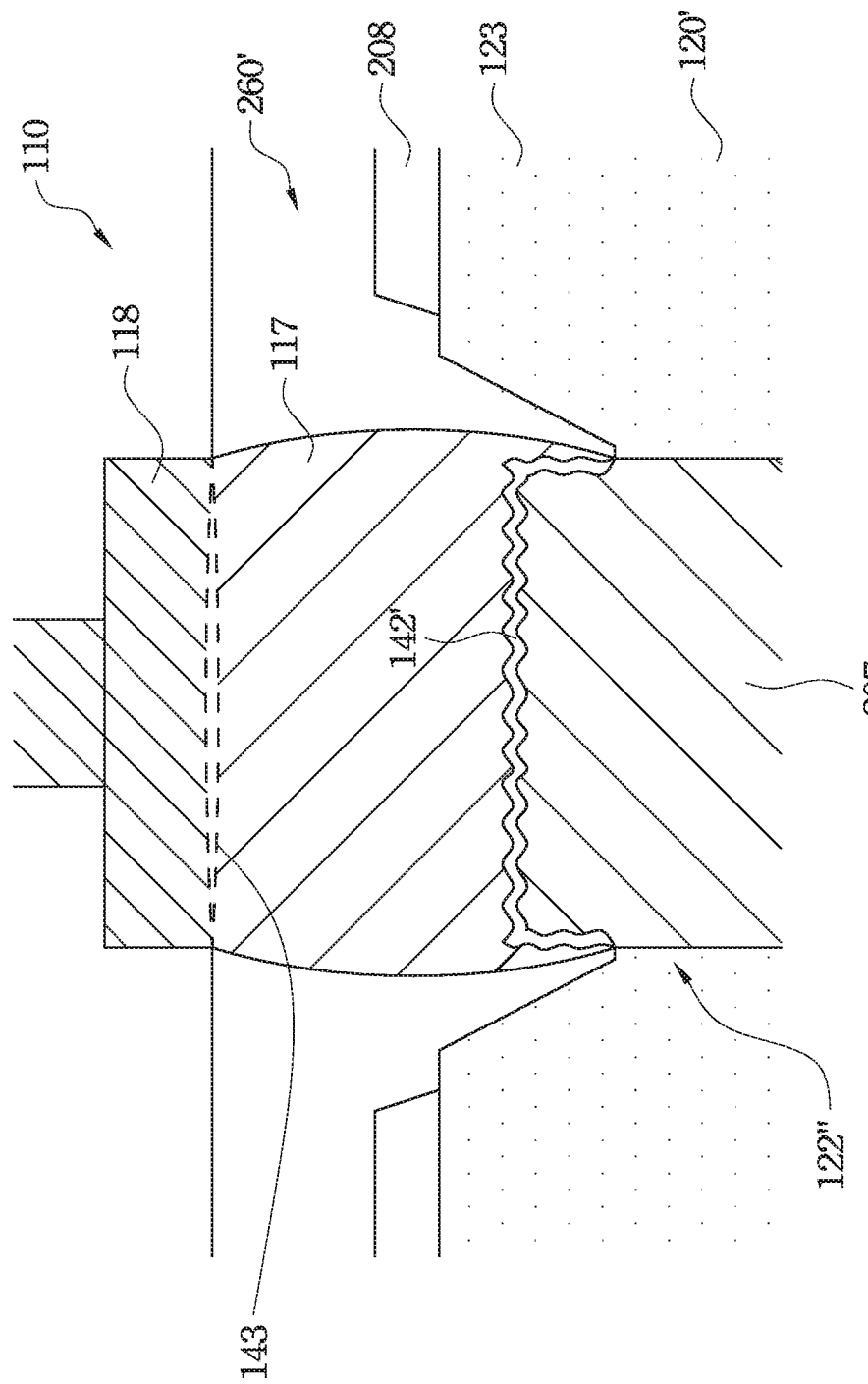
FIGS. 4A-4C show cross-sectional views of various bonding structures, in accordance with some embodiments.
Figure 4B:
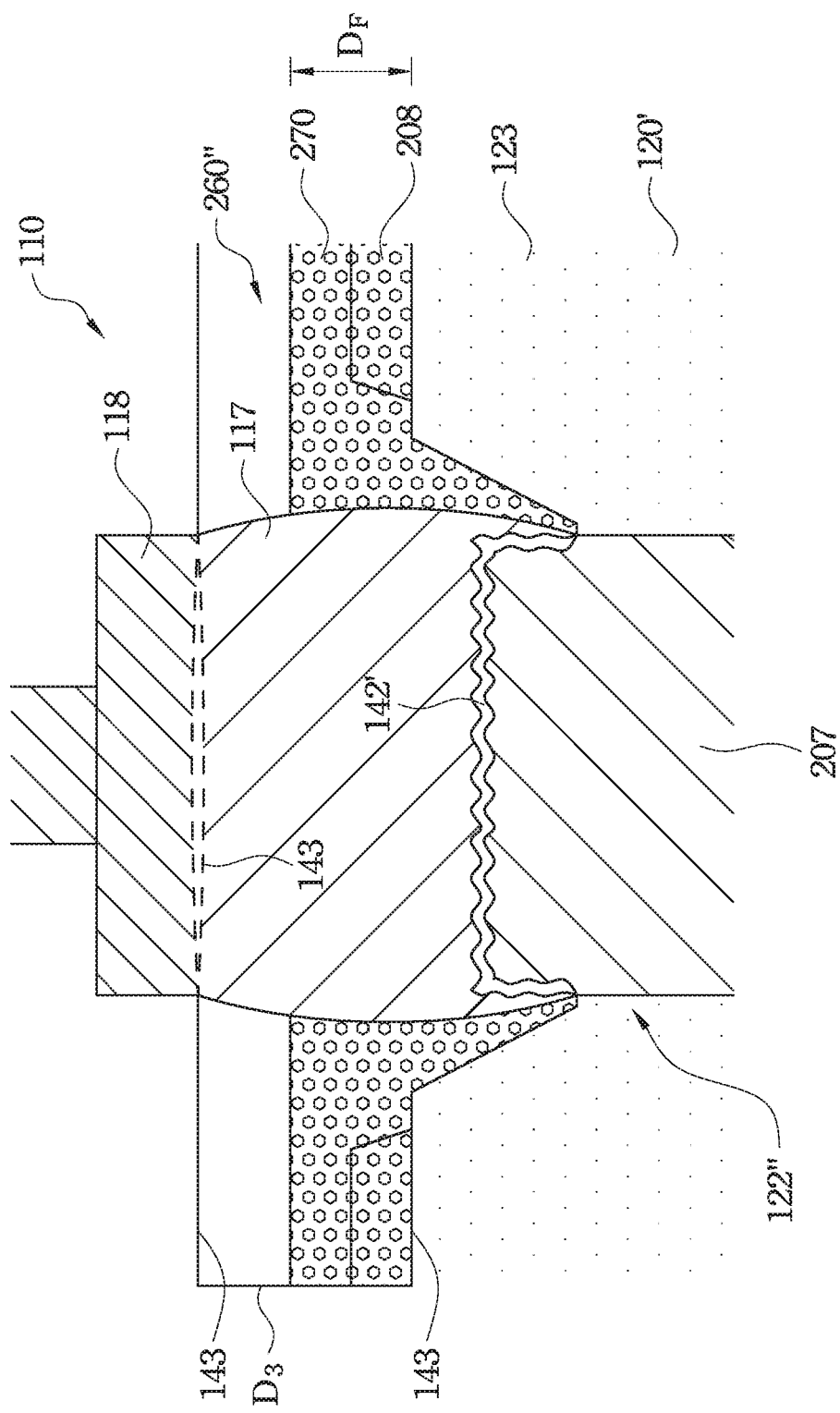
Figure 4C:
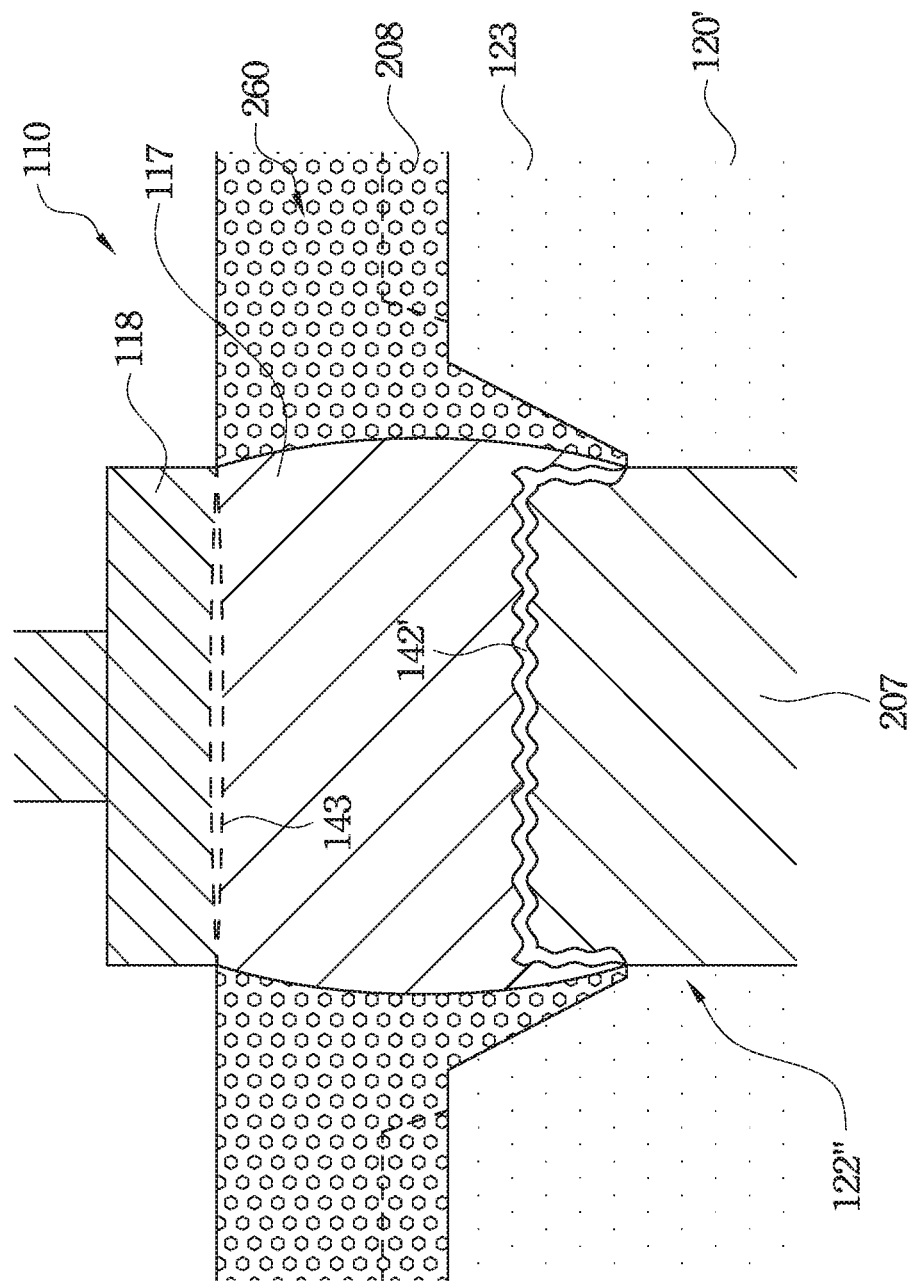

By forming removing materials surrounding the top portions of TPVs 122" to form openings 220 surrounding the top portions of TPVs 122", the IMC layer 142" formed on each TPV 122" is not a two-dimensional (2D) surface layer, such as IMC layer 142 of FIG. 1B, which cracks easily at corners under stress. Instead, IMC layer 142" is a three-dimensional (3D) layer covering the surface of portion of a TPV 122" protruding above molding compound 123, as shown in FIG. 2O. Such 3D layer is stronger and is less likely to crack under stress. As a result, the bonding structures formed by connectors 117 and TPVs 122" are stronger than those without openings 220, such as the ones described in FIG. 1B. Region Y in FIG. 2O includes a bonding structure 260' with a connector 117 and a TPV 122". Various embodiments of structures in region Y are shown in FIGS. 4A-4C and are described below.

Figure 3A:
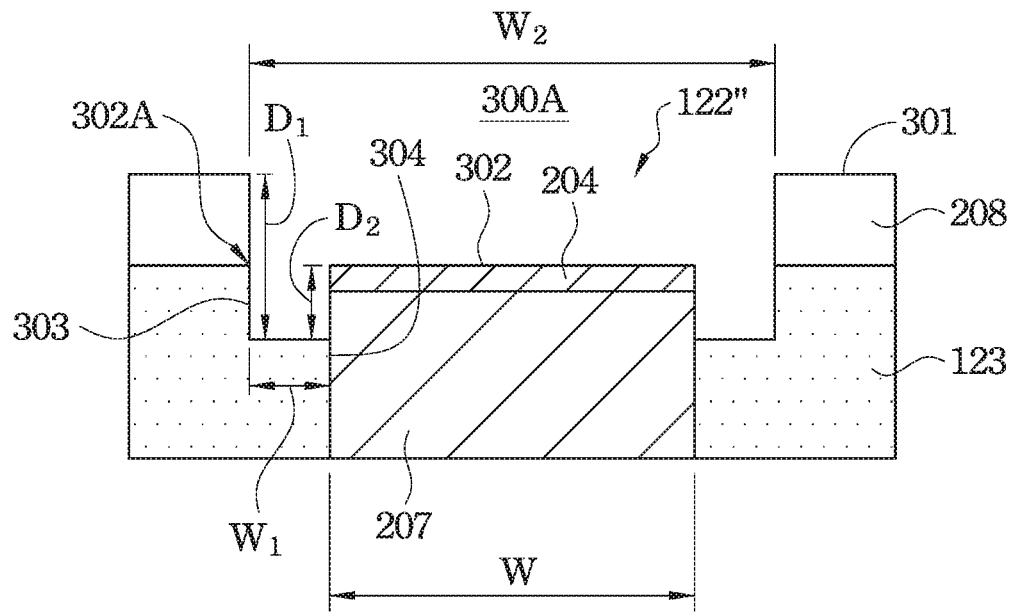
FIGS. 3A-3H show cross-sectional views of various structures surrounding the exposed top portion of a through package via (TPV), in accordance with some embodiments.

FIG. 3A shows an enlarged view of region X of FIG. 2N, in accordance with some embodiments. Region X includes TPVs 122", which are surrounded by molding compound 123. TPVs 122" are connected to RDLs 213, which are insulated by passivation layers 212 and 214, as described above. FIG. 3A shows that TPVs 122" includes a plating seed layer 204 over conductive layer 207. The passivation layer 208 and molding compound 123 covering the plating seed layer 204 and top portion of conductive layer 207 are removed, such as by laser drill, to form opening 300. If the plating seed layer 204 and the conductive layer 207 are both made of the same conductive material, such as copper or copper alloy, the TPV 122" would appear to be made of a single material without an obvious interface.

Opening 300 has a depth $D_1$ below the surface 301 of 208. In some embodiments, $D_1$ is in a range from about 2 μm to about 100 μm. Opening 300 has a depth $D_2$ below the surface 302 of plating seed layer 204. In some embodiments, $D_2$ is in a range from about 1 μm to about 70 μm. The lower portion of opening 300 has a width $W_1$ from a surface 304 of sidewall of TPV 122" to a surface 303 of sidewall of molding compound 123. In some embodiments, $W_1$ is in a range from about 2 μm to about 50 μm. The top width $W_2$ of opening 300 is wider than the width W of TPV 122". In some embodiments, $W_2$ is in a range from about 30 μm to about 300 μm.

Figure 3B:
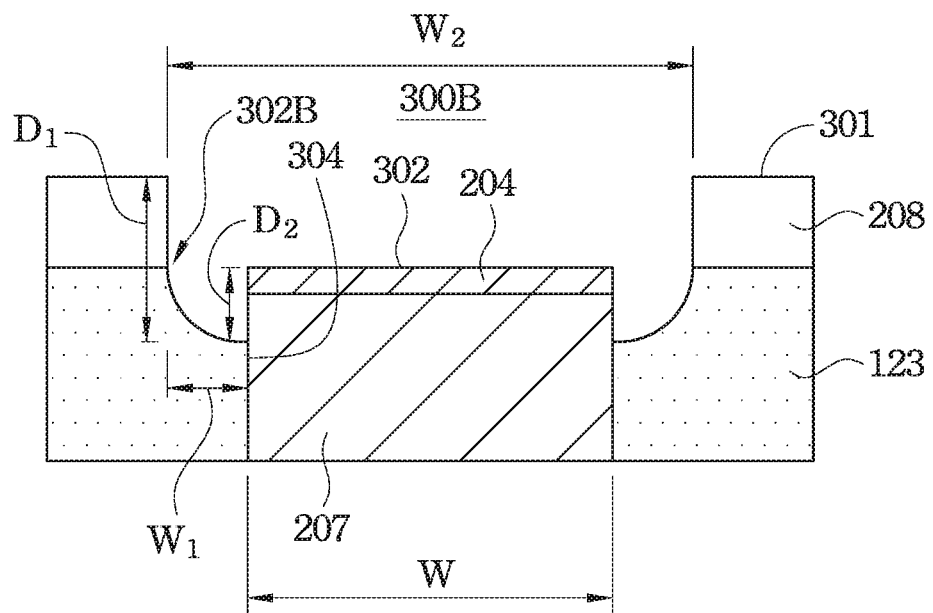

FIG. 3A shows that the sidewalls of opening 303 are substantially vertical and are substantially perpendicular to the bottom surfaces of opening 300. In addition, the surfaces of sidewalls are continuous and smooth. Alternatively, the corners at the molding compound 123 of opening 300' could be rounded, as shown in FIG. 3B in accordance with some embodiments. The remaining portions, such as the ranges of $D_1$, $D_2$, $W_1$, and $W_2$, of opening 300' are similar to opening 300.

FIGS. 3A and 3B show that the connections, $302_A$ and $302_B$, of the sidewalls of passivation layer 208 and the sidewalls of molding compound 123 is smooth. The smooth connection, $302_A$ and $302_B$, between the sidewalls is achieved by controlling the laser drill process, whose process parameters include drill energy, drill angle, and drill time. The drill process is tuned to remove passivation layer 208 and molding compound 123, not plating layer 204 or conductive layer 207. In some embodiment, the drill energy is in a range from 0.1 mJ to about 30 mJ. In some embodiments, the drill angle is in a range from about 0 degree (perpendicular to surface 301) to about 85 degrees to normal of surface 301 of passivation layer 208. In some embodiments, the drill time is in a range from about 1 μs to about 150 μs for each opening $300_A$ or $300_B$.

Figure 3C:
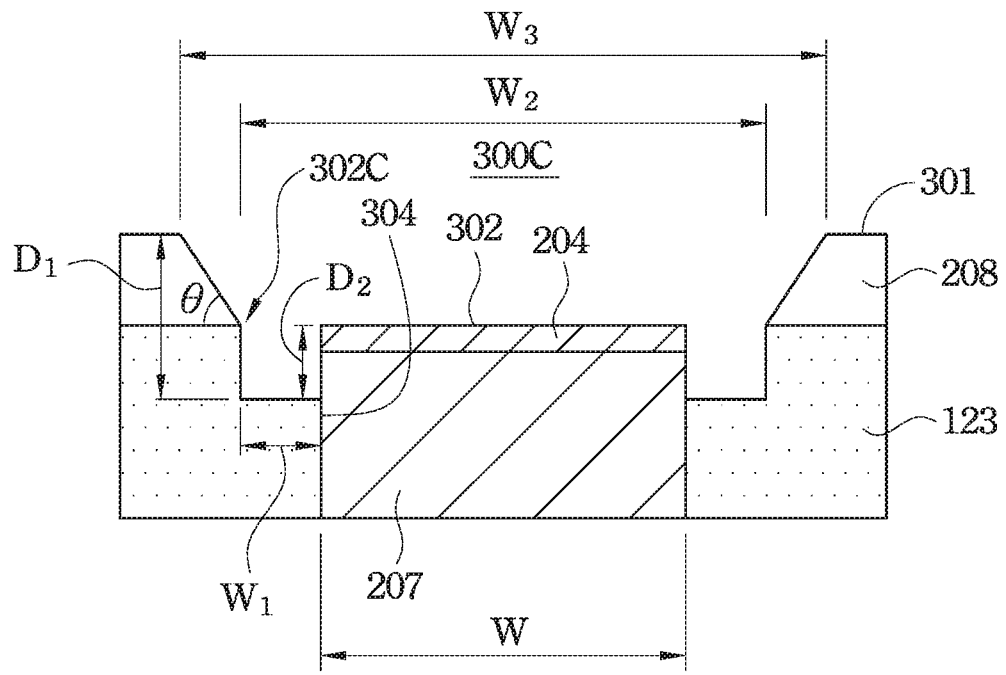

As described above, FIGS. 3A and 3B show that the connection, $302_A$ and $302_B$, of the sidewalls of passivation layer 208 and the sidewalls of molding compound 123 is smooth. Alternatively, the connection of the between the sidewalls of these two layer may not be smooth. FIG. 3C shows an opening $300_C$ with the sidewalls 303 of molding compound 123 being substantially vertical, in accordance with some embodiments. However, the sidewalls of passivation layer 208 are slanted with an angle θ from a surface parallel to surface 302 of passivation layer 208. In some embodiment, the angle θ is in a range from about 10 degrees to about 85 degrees. As a result, the connection $302_C$ between sidewalls of opening $300_C$ of passivation layer 208 and molding compound 123 is not smooth and has a sharp corner. The widest portion of opening $300_C$ has a width $W_3$. In some embodiments, $W_3$ is in a range from about 30 μm to about 300 μm. The remaining portions, such as the ranges of $D_1$, $D_2$, $W_1$ and $W_3$, of openings $300_C$ are similar to those in FIG. 3A. The laser drill process can be tuned to create the profile shown in FIG. 3C. Other sidewall profiles of passivation layer 208 and molding compound 123 are also possible.

Figure 3D:
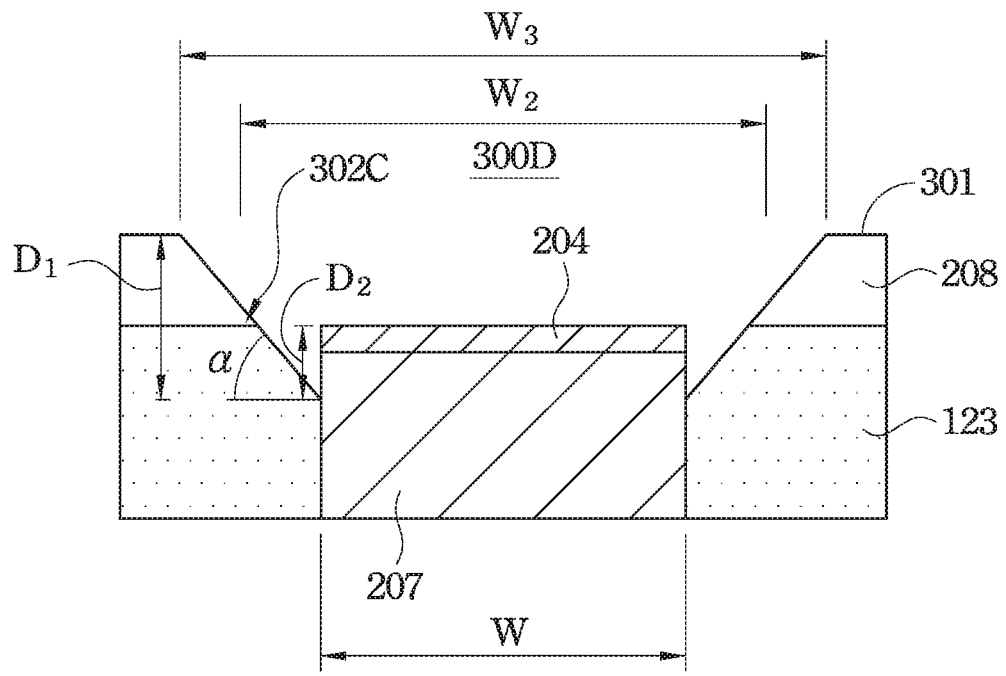

FIG. 3D shows an opening $300_D$ with the sidewalls of passivation layer 208 and molding compound 123 being slanted at an angle α from a surface parallel to surface 301 of passivation layer 208, in accordance with some embodiments. In some embodiment, the angle α is in a range from about 10 degrees to about 85 degrees. The remaining portions, such as the ranges of $D_1$, $D_2$ and $W_3$, of FIG. 3D are similar to FIG. 3C.

Figure 3E:
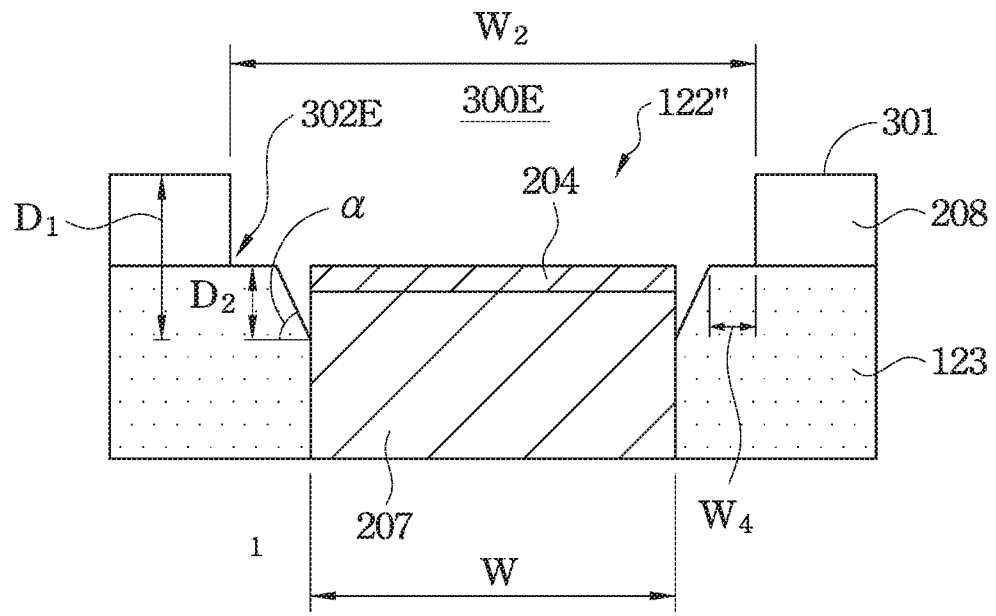

FIG. 3E shows an opening 300$_E$ with slanted sidewalls on molding compound 123 and substantially vertical sidewalls on passivation layer 208, in accordance with some embodiments. There is a ledge on connection 302$_E$ between sidewalls of molding compound 123 and sidewalls of passivation layer 208. The distance of the ledge $W_4$ is in a range from about 2 μm to about 40 μm. The remaining portions, such as the ranges of $D_1$, $D_2$, $W_2$, $W_3$ and angle α, of FIG. 3E are similar to those described in FIGS. 3C and 3D.

Figure 3F:
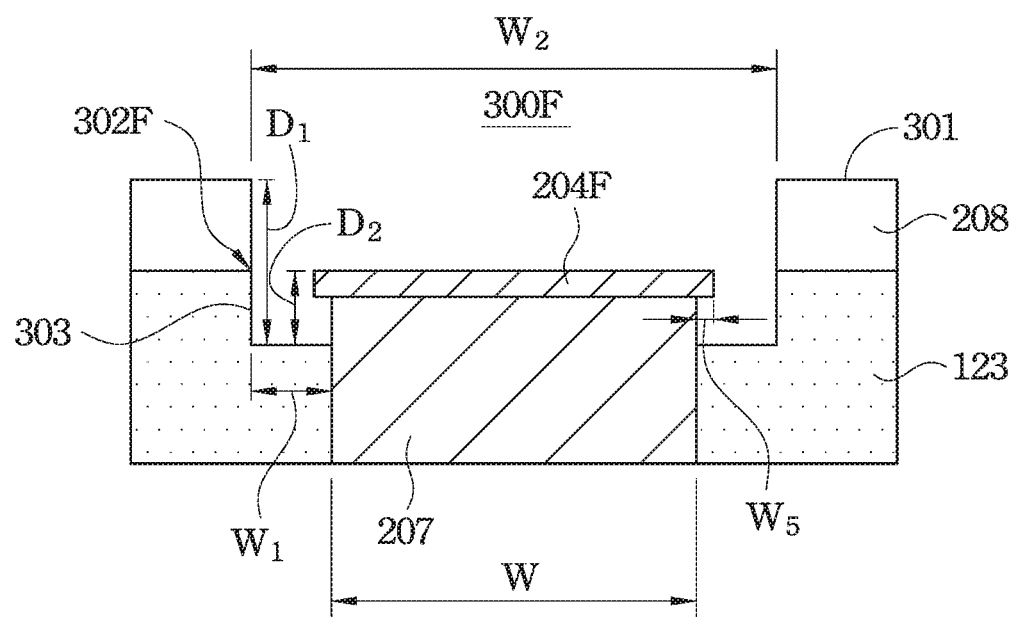

FIG. 3F shows an opening 300$_F$ wherein the plating seed layer 04$_F$ is larger than the conductive layer 207, in accordance with some embodiments. The structure in FIG. 3F is similar to the structure in FIG. 3A, expect the plating seed layer 204$_F$ is wider than the conductive layer 207. The different in widths (or the protruding width) $W_5$ is in a range from about 0.001 μm to about 1 μm. The protruding portions of plating seed layer 204$_F$ are formed during the removing the plating seed layer 204 not covered by conductive layer 207, as described in FIG. 2E. The etch time of the removing process can be controlled to leave small portions of plating seed layer 204 not covered by conductive layer 207. The remaining portions, such as the ranges of $D_1$, $D_2$, $W_1$, and $W_2$, of FIG. 3F are similar to those described in FIG. 3A. However, other profiles described in FIGS. 3B-3E may also be applied in the embodiment of FIG. 3F.

Figure 3G:
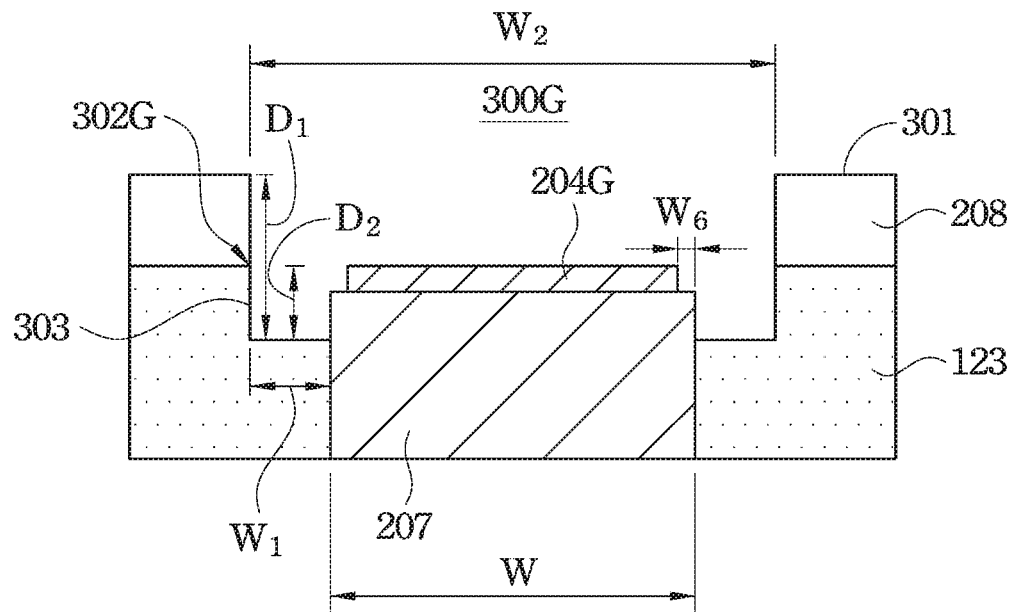

FIG. 3G shows an opening 300$_G$ wherein the plating seed layer 204$_G$ is indented from the conductive layer 207, in accordance with some embodiments. FIG. 3G is similar to FIG. 3F, except the plating seed layer 204$_G$ is narrower than the conductive layer 207. The recess $W_6$ is in a range from about 0.001 μm to about 1 μm. The recess may be formed by over-etching (or with longer etching time) during the removal of plating seed layer 204 not covered by conductive layer 207, as described in FIG. 2E. Similarly, other profiles described in FIGS. 3B-3E may also be applied in the embodiment of FIG. 3G.

Figure 3H:
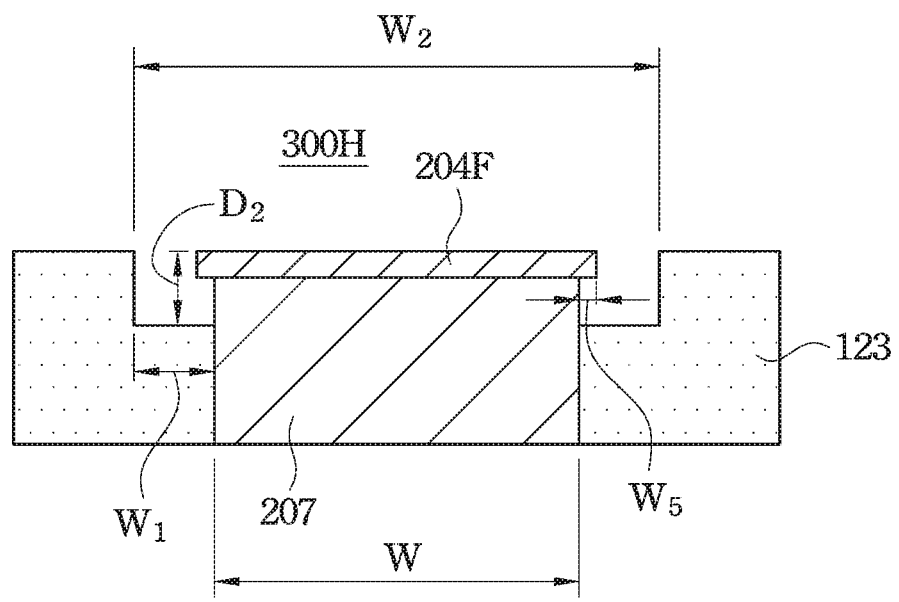

FIG. 3H shows an opening 300$_H$ with substantially sidewalls on molding compound 123 and without the passivation layer 208, in accordance with some embodiments. The passivation layer 208 is removed in this instance. The passivation layer 208 is removed prior to the formation of opening 300$_H$, in accordance with some embodiments. The remaining portions, such as the ranges of $D_2$, $W_1$, and $W_2$, of FIG. 3H are similar to those described in FIG. 3A. Other profiles described in FIGS. 3B (rounded lower corners of opening), 3D (slanted sidewalls), 3F (protruding plating seed layer) and 3G (recessed plating seed layer) may also be applied in the embodiment of FIG. 3H.

As mentioned above, region Y in FIG. 2O includes a bonding structure 260' with a connector 117 from an upper die package 110 and a TPV 122" of a lower die package 120'. Various embodiments of structures in region Y are described below. FIG. 4A shows a bonding structure 260' with connector 117 bonded to the top portion of TPV 122" not embedded in molding compound 123 and passivation layer 208, in accordance with some embodiments. The structure near TPV 122" prior to bonding is a hybrid between structures of FIG. 3D and FIG. 3E described above. The opening 300' has slanted sidewalls on both passivation layer 208 and molding compound 123. The passivation layer 208 is recessed back from an edge of the molding compound 123, as shown in FIG. 4A. After the bonding process (a thermal process), an IMC layer 142' is formed by the material(s), such as Cu, Ti, or both, in the plating seed layer 204 and solder material of connector 117. Depending on the bonding process, a portion of conductive layer 207 (copper) could be in the IMC layer 142'. The IMC layer 142' caps around the protruding portion of TPV 122". The IMC layer 142 has a top portion, which is substantially flat, and a side portion, which forms a ring that surrounds the protruding TPV 122". The IMC layer 142' has a thickness in a range from about 0.2 μm to about 8 μm. The upper portion of connector 117 may form another IMC layer 143 with the bonding pad 118. The thickness of IMC layer 143 depends on the material of bonding pad 118. Some conductive materials, such as Ni, Au, Ag, do not form or formed a very thin IMC layer 143 with solder in connector 117. Therefore, IMC layer 143 could be non-existent in some embodiments.

Due to the opening 300' surrounding the protruding portion of TPV 122", the placement of the connector 117 would be more accurate and the connector 117 would not slide horizontally to miss part of the TPV 122". Horizontal sliding of connectors 117 could occur when the connectors 117 are placed and bonded to TPVs 122 that are flush with molding compound 123, such as those in FIG. 1B. Such sliding could cause connectors 117 shorting to neighboring TPVs 122. In addition, the IMC layer 142' formed is shaped as a cap (a 3D structure), not a surface (a 2D structure). As a result, the IMC 142' does not easily become a weakest point of the bonding structure and does not crack as easily as the boding structure 260 of FIG. 1B. This observation is supported by studies. The yield and reliability of bonding structure 260' are better than bonding structure 260.

FIG. 4B shows a portion of bonding structure 260' embedded in a polymer layer 270, in accordance with some embodiments. As mentioned above, the molding compound 123 surrounding the top portion of TPV 122" has been removed, such as by laser drill. A passivation layer 208 may or may not present above molding compound 123. The presence of the passivation layer 208 is optional. Polymer layer 270 is formed around the lower portion of bonding structure 260". Prior to bonding die package 110 to die package 120', flux could be applied on the surface of die package 120' and covers the exposed surfaces of TPV 122" and molding compound 123. The applied flux presents oxidation of exposed plating seed layer 204 and conductive layer 207 from the environment and during bonding process. Flux is polymer-containing liquid when it is applied on the surface of package 120' and is often removed, such as by a cleaning solution, after the bonding process is completed. However, flux can be left on the surface of package 120' and becomes polymer layer 270, which yields under stress and can protect the bonding structure 260' from cracking. The polymers contained in flux could be epoxy or other types of polymers. The thickness $D_F$ of polymer layer 270 is in a range from about 0.5 μm to about 30 μm. Thickness DF can be measured from the surface molding compound 123, if passivation layer 208 does not exist, or from the surface of passivation layer 208, if passivation layer 208 exists. There is a distance $D_S$ between a surface 305 of package 110 facing package 120' and a surface 306 of molding compound 123. $D_F$ is smaller than $D_S$, in accordance with some embodiments.

FIG. 4C shows bonding structure 260' embedded in an underfill 275, in accordance with some embodiments. As mentioned above, the molding compound 123 surrounding the top portion of TPV 122" has been removed, such as by laser drill. A passivation layer 208 may or may not present above molding compound 123. The presence of the passivation layer 208 is optional. An underfill 275 is formed to surround bonding structure 260' after connector 117 is bonded to TPV 122". The underfill 275 contains polymers, such as UF3808 and UF3810 (both are epoxy-based underfill materials) As shown in FIG. 4C, underfill 275 fills the space between die packages 110 and 120'. Underfill 275, which is made of polymers, yields under stress and protects the bonding structure 260' from cracking.

Various embodiments of mechanisms for forming through package vias (TPVs) with openings surrounding end-portions of the TPVs and a package on package (PoP) device with bonding structures utilizing the TPVs are provided. The openings are formed by removing materials, such as by laser drill, surrounding the end-portions of the TPVs. The openings surrounding the end-portions of the TPVs of the die package enable solders of the bonding structures formed between another die package to remain in the openings without sliding and consequently increases yield and reliability of the bonding structures. Polymers may also be added to fill the openings surrounding the TPVs or even the space between the die packages to reduce cracking of the bonding structures under stress.

In some embodiments, a semiconductor device is provided. The semiconductor device includes a semiconductor die, and a dielectric material adjacent the semiconductor die. The semiconductor device also includes a through package via (TPV) disposed in the dielectric material. An opening in the dielectric material surrounds an end portion of the TPV to expose the end portion, and wherein at least a portion of the opening is between the end portion of the TPV and molding compound.

In some embodiments, a semiconductor device is provided. The semiconductor device includes a semiconductor die, and one or more dielectric layers adjacent the semiconductor die. The semiconductor die also includes one or more through package vias (TPVs) disposed in the one or more dielectric layers. The one or more TPVs extends from first side of the one or more dielectric layers to a second side of the one or more dielectric layers. The semiconductor device further includes recesses in the one or more dielectric layers surrounding corresponding ends of the one or more TPVs. The recesses expose at least a portion of sidewalls of corresponding ends of the one or more TPVs.

In yet some embodiments, a semiconductor device is provided. The semiconductor device includes a first die package. The first die package includes a first semiconductor die, and dielectric material on opposing sides of the first semiconductor die. The first die package also includes a through via (TV) in the dielectric material, and an opening in the dielectric material surrounds an end portion of the TV to expose the end portion. The semiconductor device also includes a second die package. The second die package includes a second semiconductor die, and an external connector. The external connector of the second die package is bonded to the end portion of the TV of the first die package using solder to form a bonding structure. The solder is at least partially within the opening.

In yet other embodiments a method of forming a semiconductor device is provided. The method includes forming a passivation layer over a substrate, forming a conductive pillar over the passivation layer, forming a molding compound over the passivation layer, the molding compound extending along sidewalls of the conductive pillar, and after forming the passivation layer and the molding compound, forming a recess in the passivation layer and the molding compound adjacent the conductive pillar, sidewalls of the conductive pillar being exposed in the recess, wherein the recess encircles the conductive pillar in a plan view.

In yet other embodiments a method of forming a semiconductor device is provided. The method includes forming a dielectric layer over a molding compound and a conductive pillar, the molding compound extending along sidewalls of the conductive pillar and a first die, and after forming the dielectric layer, forming a recess in the dielectric layer, the recess extending into the molding compound, the recess exposing sidewalls of the conductive pillar.

In yet other embodiments a method of forming a semiconductor device is provided. The method includes forming a dielectric layer on a substrate, forming a conductive pillar on a dielectric layer, placing a die on the dielectric layer, forming a molding compound over the substrate, the molding compound extending along sidewalls of the conductive pillar and the die, and forming a redistribution layer (RDL) over a first side of the molding compound and the die, the first side of the molding compound being opposite the substrate. The method further includes removing the substrate, and after removing the substrate, forming a recess in the dielectric layer and the molding compound, thereby exposing sidewalls of the conductive pillar.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device comprising:
   a semiconductor die;
   a first insulating material adjacent the semiconductor die;
   a second insulating material overlying the first insulating material; and
   a through package via (TPV) disposed in the first insulating material, wherein a recess in the first insulating material surrounds an end portion of the TPV to expose the end portion, wherein the recess extends through the second insulating material and into the first insulating material, and wherein at least a portion of the recess is between the end portion of the TPV and first insulating material compound, wherein the first insulating material encircles the end portion of the TPV.

2. The semiconductor device of claim 1, wherein the end portion of the TPV extends above a bottom of the recess a distance from about 1 μm to about 70 μm.

3. The semiconductor device of claim 1, wherein the recess has a depth from about 2 μm to about 100 μm.

4. The semiconductor device of claim 1, wherein the recess has a rounded surface profile.

5. The semiconductor device of claim 1, wherein the recess includes a linear sidewall of the first insulating material intersecting a linear sidewall of the TPV.

6. The semiconductor device of claim 5, wherein an angle between the linear sidewall of the first insulating material and a line normal to the linear sidewall of the TPV is from about 10 degrees to about 85 degrees.

7. The semiconductor device of claim 1, wherein a sidewall of the opening is parallel to a sidewall of the end portion of the TPV.

8. The semiconductor device of claim 1, wherein a top surface of the first insulating material forms a ledge in the recess.

9. A semiconductor device comprising:
a semiconductor die;
one or more first insulating layers adjacent the semiconductor die;
one or more through package vias (TPVs) disposed in the one or more first insulating layers;
recesses in the one or more first insulating layers, the recesses surrounding corresponding ends of the one or more TPVs, the recesses exposing at least a portion of sidewalls of corresponding ends of the one or more TPVs, the recesses being disconnected from each other; and
solder material on the one or more TPVs, the solder material extending into the recesses and extending along sidewalls of the one or more TPVs, the solder material comprising a different material than material of the one or more TPVs.

10. The semiconductor device of claim 9, wherein the solder material extends between sidewalls of the recesses and corresponding ends of the one or more TPVs.

11. The semiconductor device of claim 10, wherein the solder material extends to a bottom of the recesses.

12. The semiconductor device of claim 9, further comprising a second insulating layer over the one or more first insulating layers, the recesses extending through the second insulating layer and into the one or more first insulating layers.

13. The semiconductor device of claim 12, wherein a bottommost surface of the second insulating layer is above an uppermost surface of the one or more TPVs.

14. The semiconductor device of claim 13, wherein the one or more TPVs extends above a bottom of the corresponding recesses a distance from about 1 μm to about 70 μm.

15. The semiconductor device of claim 9, further comprising a semiconductor package bonded to the one or more TPVs by the solder material.

16. A semiconductor device comprising:
a first die package, wherein the first die package comprises:
a first semiconductor die;
a first insulating material on opposing sides of the first semiconductor die; and
a through via (TV) in the first insulating material, wherein a recess in the first insulating material surrounds an end portion of the TV to expose sidewalls of the end portion; and
a second die package having a second semiconductor die and a contact; and
an external connector interposed between the contact of the second die package and the end portion of the TV, wherein the external connector extends into the recess such that at least a portion of the external connector is interposed directly between the end portion of the TV and the first insulating material.

17. The semiconductor device of claim 16, wherein the external connector comprises a solder.

18. The semiconductor device of claim 16, wherein the external connector extends to a bottom of the recess.

19. The semiconductor device of claim 16, further comprising a second insulating material over the first insulating material between the first die package and the second die package, wherein the recess extends through the second insulating material and at least a portion of the external connector is embedded in the second insulating material.

20. The semiconductor device of claim 16, further comprising an underfill interposed between the first die package and the second die package, wherein the underfill partially fills the recess.

* * * * *